United States Patent
Chann et al.

(10) Patent No.: US 8,670,180 B2
(45) Date of Patent: Mar. 11, 2014

(54) WAVELENGTH BEAM COMBINING LASER WITH MULTIPLE OUTPUTS

(75) Inventors: Bien Chann, Merrimack, NH (US); Robin Huang, North Billerica, MA (US)

(73) Assignee: Teradiode, Inc., Wilmington, MA (US)

( * ) Notice: Subject to any disclaimer, the term of this patent is extended or adjusted under 35 U.S.C. 154(b) by 361 days.

(21) Appl. No.: 13/218,327

(22) Filed: Aug. 25, 2011

(65) Prior Publication Data
US 2011/0310921 A1      Dec. 22, 2011

Related U.S. Application Data

(63) Continuation-in-part of application No. 13/042,042, filed on Mar. 7, 2011, now Pat. No. 8,553,327.

(60) Provisional application No. 61/376,900, filed on Aug. 25, 2010, provisional application No. 61/310,777, filed on Mar. 5, 2010, provisional application No. 61/310,781, filed on Mar. 5, 2010, provisional application No. 61/417,394, filed on Nov. 26, 2010.

(51) Int. Cl.
*G02B 27/64* (2006.01)

(52) U.S. Cl.
USPC ............................................ 359/556; 359/621

(58) Field of Classification Search
USPC ......... 359/618, 299, 624, 245, 241, 244, 288, 359/305, 285, 308, 311–312, 290–292, 872, 359/263, 223–224, 318, 649, 846, 129, 496, 359/631, 629, 634, 636, 638–640, 831, 359/833–834, 630, 341.3, 341.33, 337.21; 451/28, 41; 372/25, 92, 98, 102; 353/31, 34, 81

See application file for complete search history.

(56) References Cited

U.S. PATENT DOCUMENTS 5,168,401 A * 12/1992 Endriz ........................... 359/625
5,790,576 A *  8/1998 Waarts et al. .............. 372/50.23

* cited by examiner

*Primary Examiner* — Dawayne A Pinkney
(74) *Attorney, Agent, or Firm* — Ascentage Law, PLLC; Travis L. Johnson

(57) ABSTRACT

A system and method for producing a multi-output laser by reconfiguring and apportioning a plurality of electromagnetic beams produced by various wavelength beam combining techniques. The reconfiguring of beams includes individual rotation and selective repositioning of one or more beams with respect to beam's original input position.

24 Claims, 20 Drawing Sheets

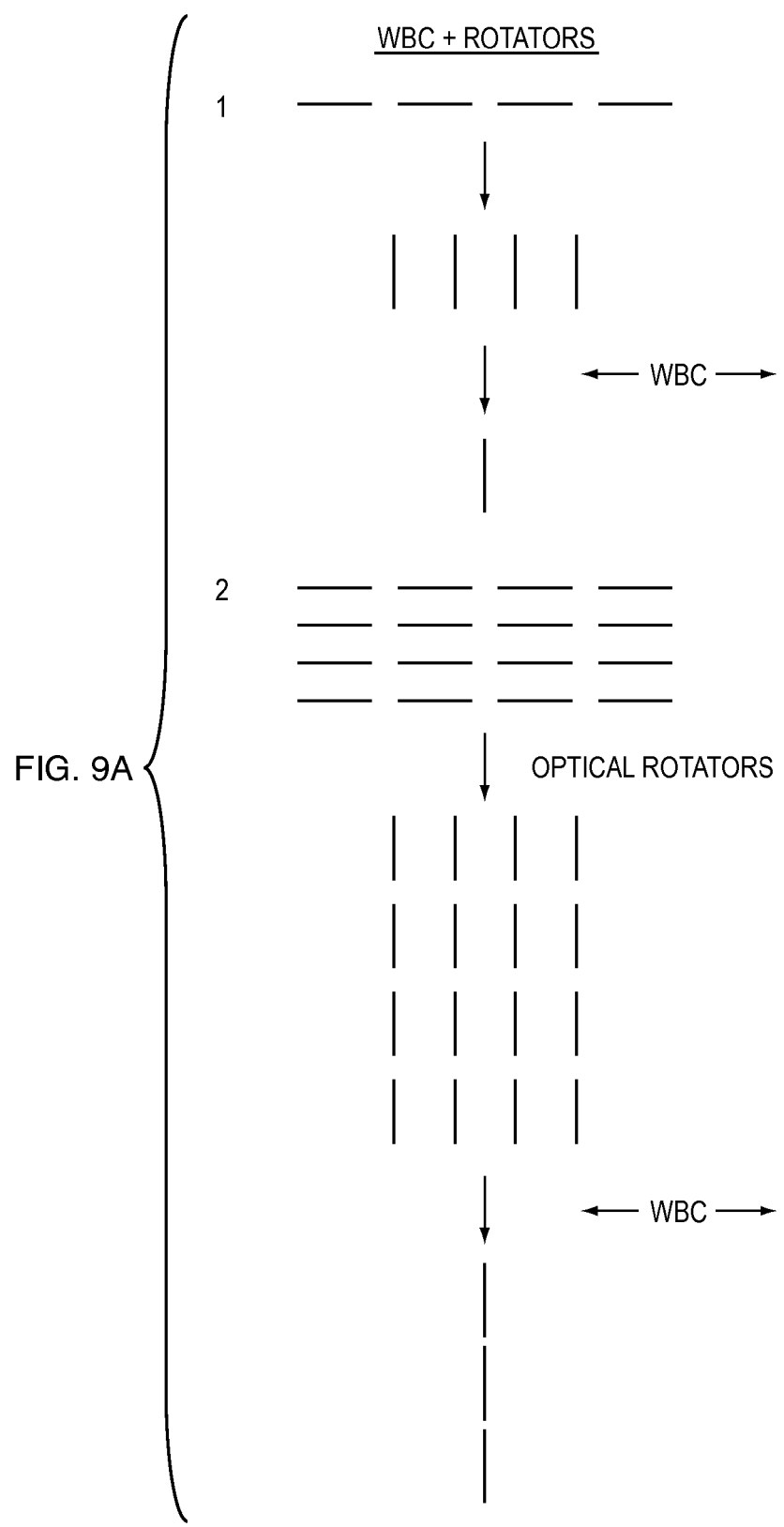

WAVELENGTH BEAM COMBINING LASER WITH MULTIPLE OUTPUTS

CROSS-REFERENCE TO RELATED APPLICATIONS

This application claims priority to the following U.S. Provisional Patent Application, of which is hereby incorporated by reference in its entirety: U.S. Ser. No. 61/376,900, filed Aug. 25, 2010. This application also claims priority under 35 U.S.C. §120 as a continuation-in-part to the following U.S. Non-provisional Patent Application, of which is hereby incorporated by reference in its entirety: U.S. Ser. No. 13/042,042 filed Mar. 7, 2011, which claims priority to each of the following U.S. Provisional Patent Applications, of which are hereby incorporated in their entirety: U.S. Ser. No. 61/310,777 filed Mar. 5, 2010; U.S. Ser. No. 61/310,781 filed Mar. 5, 2010, and U.S. Ser. No. 61/417,394 filed Nov. 26, 2010.

COPYRIGHT STATEMENT

A portion of the disclosure of this patent application document contains material that is subject to copyright protection including the drawings. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

1. Field of the Invention

The present embodiments relate generally to laser systems and more particularly to multi-output laser systems.

2. Description of the Prior Art

Multiple output beam laser systems are desirable for many applications. In materials processing a single laser system with up to six output beams is sometimes preferred over six individual laser systems each with a single output beam. For example, a single 6-kW laser system with six output beams, where each output beam operating at 1 kW, may be preferred over six 1-kW laser systems. Some of the advantages include having a smaller footprint, higher efficiency, flexibility, and lower cost. Another application utilizing a multiple output beam laser system occurs when pumping fiber lasers. Some fiber laser systems require up to twelve or more pump lasers (sources). Again the options are to use twelve individual laser pumps or create a single system having twelve output beams.

Current solutions used to create multiple output systems generally use a single symmetrical beam and a series of partial reflectors as illustrated in FIGS. 11A-B. However, recent developments for Wavelength Beam Combining (WBC) lasers provide certain advantages over conventional lasers emitting a single symmetrical beam. See for example, U.S. Pat. Nos. 6,192,062, 6,208,679 and 2010/0110556 A1, where advantages include scalability, robust design, higher power outputs, higher brightness, reliability and in some cases cost effectiveness. WBC laser systems do not have the same output profile as a conventional laser system and therefore, it is desirable to create multiple output beam systems designed to take advantage of the intrinsic properties associated with WBC laser systems.

The following application seeks to solve the problems stated.

SUMMARY OF THE INVENTION

Optical and mechanical means have been developed to selectively rotate and/or selectively reposition emitted electromagnetic beams into a desired orientation and/or pattern in a one-dimensional or two-dimensional array for use with various wavelength beam combining systems and methods. These rotating and/or repositioning/reshaping means may be positioned both internally and externally in a WBC laser cavity system.

Additional methods of selectively portioning beam profiles and coupling or directing each portioned profile into an optical fiber or at a distinct location have been developed. In particular, these systems and methods are favorable to emitters that have a fixed-position relationship to other emitters.

BRIEF DESCRIPTION OF THE DRAWINGS

FIG. 9A illustrates embodiments using an optical rotator before WBC step in both single and stacked array configurations.

DETAILED DESCRIPTION OF THE PREFERRED EMBODIMENT

Aspects and embodiments relate generally to the field of scaling laser sources to high-power and high-brightness using an external cavity and, more particularly, to methods and apparatus for external-cavity beam combining using both one-dimensional or two-dimensional laser sources. In one embodiment the external cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to make sure all the elements along the non beam combining dimension are propagating normal to the output coupler. Care must be taken to ensure that the optical system introduces as little loss as possible. As such, these two functions will enable a single resonance cavity for all the laser elements. In another embodiment the WBC external cavity system includes wavelength stabilized one-dimensional or two-dimensional laser elements, an optical system, and a dispersive element. One-dimensional or two-dimensional wavelength stabilized laser elements, with unique wavelength, can be accomplished using various means such as laser elements with feedback from wavelength chirped Volume Bragg grating, distributed feedback (DFB) laser elements, or distributed Bragg reflector (DBR) laser elements. Here the main function of the optical system is to overlap all the beams onto a dispersive element. Since there is no output coupler mirror external to the wavelength-stabilized laser element, having parallel beams along the non beam-combining dimension is less important. Aspects and embodiments further relate to high-power and/or high-brightness multi-wavelength external-cavity lasers that generate an overlapping or coaxial beam from very low output power to hundreds and even to megawatts of output power.

In particular, aspects and embodiments are directed to a method and apparatus for manipulating the beams emitted by the laser elements of these external-cavity systems and combining them using a WBC method to produce a desired output profile. Wavelength beam combining methods have been developed to combine asymmetrical beam elements across their respective slow or fast axis dimension. One advantage this invention seeks to provide is the ability to selectively-reconfigure input beams either spatially or by orientation to be used in slow and fast axis WBC methods, as well as a hybrid of the two. Another advantage is to selectively-reconfigure input beams when there is a fixed-position relationship to other input beams.

Figure 1A:
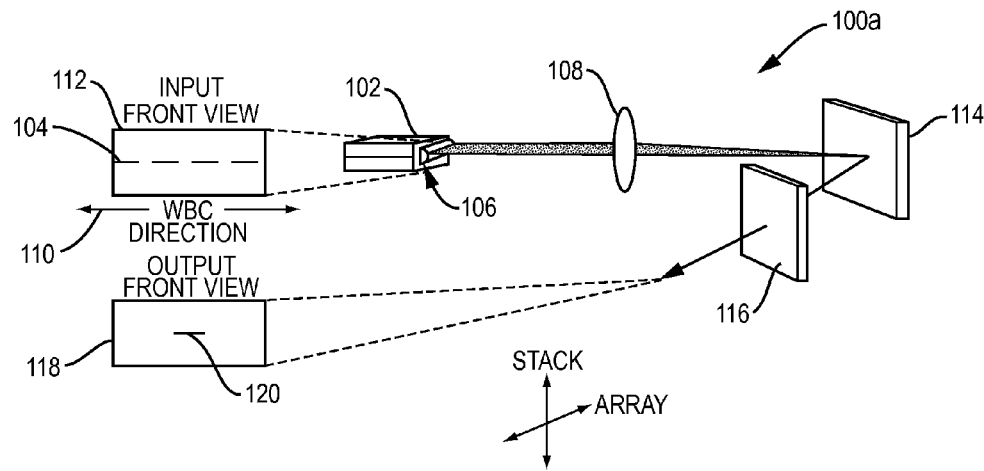
FIG. 1A is a schematic of a wavelength beam combining (WBC) method along the array dimension of a single row of emitters.

FIG. 1A illustrates a basic WBC architecture. This is the basis of U.S. Pat. Nos. 6,192,062, 6,208,679. In this particular illustration, WBC is performed along the array dimension or slow dimension for broad-area emitters. Individual beams 104 are illustrated in the figures by a dash or single line, where the length or longer dimension of the beam represents the array dimension or slow diverging dimension for broad-area emitters and the height or shorter dimension represents the fast diverging dimension. (See also left side of FIG. 8). In this related art, a diode bar 102 having four emitters is illustrated. The emitters are aligned in a manner such that the slow dimension ends of each emitted beam 104 are aligned to one another side by side along a single row—sometimes referred to as an array. However, it is contemplated that any lasing elements may be used and in particular laser elements with broad gain bandwidth. Typically a collimation lens 106 is used to collimate each beam along the fast diverging dimension. In some cases the collimation optics can be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The first-order diffracted beams are incident onto a partially reflecting mirror. The laser resonator is formed between the back facet of the laser elements and the partially reflecting mirror. As such, the combined beam is then transmitted as a single output profile onto an output coupler 116. This output coupler then transmits the combined beams 120, as shown by the output front view 118. It is contemplated creating a system devoid of an output coupler. For instance, a one-dimensional or two-dimensional system with wavelength stabilized laser elements and each having a unique wavelength can be accomplished a few ways. One system or method uses laser elements with feedback from an external wavelength chirped Volume Bragg grating along the beam combining dimension. Another uses internal distributed feedback (DFB) laser elements or internal distributed Bragg reflector (DBR) laser elements. In these systems, the single output profile transmitted from the dispersive element would have the same profile as 118. The output coupler 116 may be a partially reflective mirror or surface or optical coating and act as a common front facet for all the laser elements in diode array 102. A portion of the emitted beams is reflected back into the optical gain and/or lasing portion of diode array 102 in this external cavity system 100a. An external cavity is a lasing system where the secondary mirror is displaced at a distance away from the emission aperture or facet (not labeled) of each laser emitter. Generally, in an external cavity additional optical elements are placed between the emission aperture or facet and the output coupler or partially reflective surface.

Figure 1B:
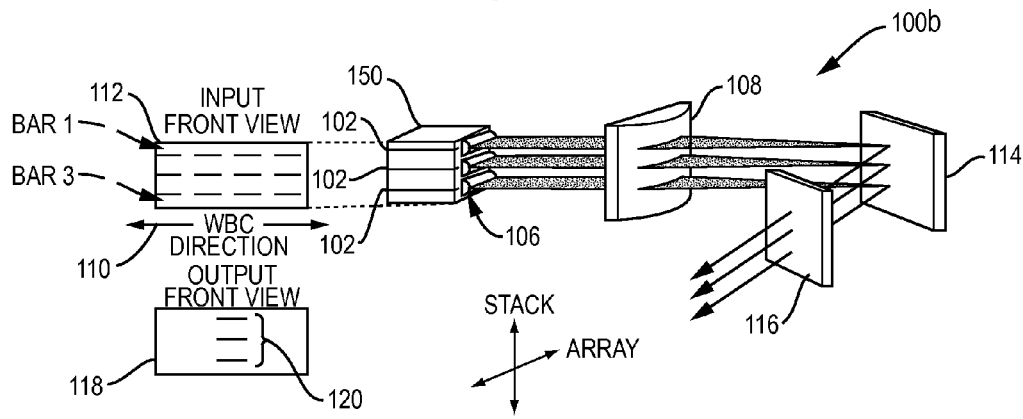
FIG. 1B is a schematic of a WBC method along the array dimension of a two-dimensional array of emitters.

Similarly, FIG. 1B illustrates a stack of laser diode bars each having four emitters where those bars are stacked three high. (See also left side of FIG. 8. Like FIG. 1A, the input front view 112 of FIG. 1B, which in this embodiment is a two-dimensional array of emitters, is combined to produce the output front view 118 or a single column of emitters 120. The emitted beams in external cavity 100b were combined along the array dimension. Here transform optic 108 is a cylindrical lens used to combine the beams along the array. However, a combination of optical elements or optical system can be used as such that the optical elements arrange for all the beams to overlap onto the dispersive element and make sure all the beams along the non-beam-combining dimension are propagating normal to the output coupler. A simple example of such an optical system would be a single cylindrical lens with the appropriate focal length along the beam-combining dimension and two cylindrical lenses that form an afocal telescope along the non beam-combining dimension wherein the optical system projects images onto the partially reflecting mirrors. Many variations of this optical system can be designed to accomplish the same functions.

The array dimension FIG. 1B is also the same axis as the slow dimension of each emitted beam in the case of multi-mode diode laser emitters. Thus, this WBC system may also be called slow axis combining, where the combining dimension is the same dimension of the beams.

Figure 1C:
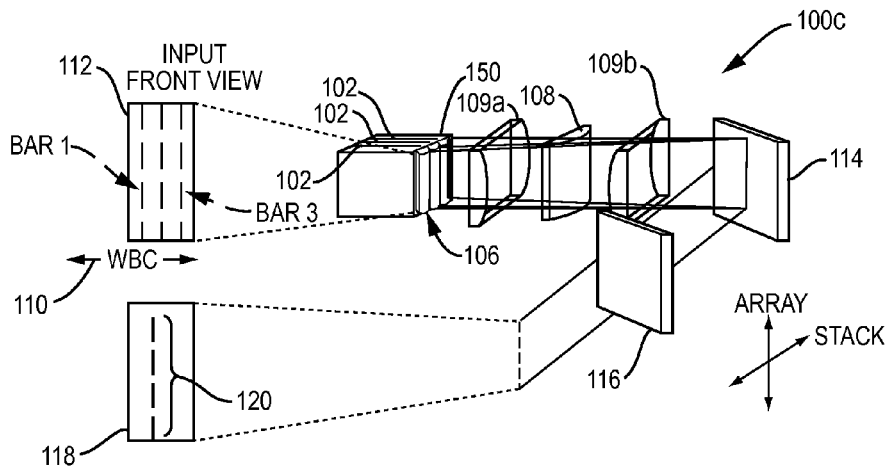
FIG. 1C is a schematic of a WBC method along the stack dimension of a two-dimensional array of emitters.

By contrast, FIG. 1C illustrates a stack 150 of laser diode arrays 102 forming a two-dimensional array of emitters, as shown by 120, where instead of combining along the array dimension as in FIGS. 1A-B, the WBC dimension now follows along the stack dimension of the emitters. Here, the stacking dimension is also aligned with the fast axis dimension of each of the emitted beams. The input front view 112 is now combined to produce the output front view 118 wherein a single column 120 of emitters is shown.

There are various drawbacks to all three configurations. One of the main drawbacks of configuration shown in FIGS. 1A and 1B is that beam combining is performed along the array dimension. As such external-cavity operation is highly dependent on imperfections of the diode array. If broad-area semiconductor laser emitters are used the spectral utilization in the WBC system is not as efficient as if beam combining is performed along the fast axis dimension. One of the main drawbacks of configurations shown in FIG. 1C is that external beam shaping for beam symmetrization is required for efficient coupling into a fiber. The beam symmetrization optics needed for a high power system having a large number of emitters may be complex and non-trivial.

Another disadvantage of configuration 1C is that the output beam quality is limited to that of a single laser bar. Typical semiconductor or diode laser bars have 19 to 49 emitters per bar with nearly diffraction-limited beam quality in one dimension and beam quality that is several hundreds of times diffraction-limited along the array dimension. After beam symmetrization the output beam 120 may be coupled into a 100 μm/0.22 Numerical Aperture (NA) fiber. To obtain higher beam quality a small number of emitter bars might be needed. For example to couple into 50 μm/0.22 NA fiber a five-emitter output beam is needed. In many industrial laser applications a higher brightness laser beam is required. For example, in some applications a two-emitter output beam is needed instead of 19 or 49. The two-emitter output beam can be coupled to a smaller core diameter fiber with much more engineering tolerance and margin. This additional margin in core diameter and NA is critical for reliable operation at high power (kW-class) power levels. While it is possible to procure five-emitter or two-emitter bars the cost and complexity is generally much higher as compared to a standard 19 or 49 emitter bars because of the significantly reduced power per bar. In this disclosure, we disclose methods to remove all of the above short comings.

The previous illustrations, FIGS. 1A-C, showed pre-arranged or fixed position arrays and stacks of laser emitters. Generally, arrays or stacks are arranged mechanically or optically to produce a particular one-dimensional or two-dimensional profile. Thus, fixed-position is used to describe a preset condition of laser elements where the laser elements are mechanically fixed with respect to each other as in the case of semiconductor or diode laser bars having multiple emitters or fiber lasers mechanically spaced apart in V-grooves, as well as other laser emitters that come packaged with the emitters in a fixed position. Alternatively, fixed position may refer to the secured placement of a laser emitter in a WBC system where the laser emitter is immobile. Pre-arranged refers to an optical array or profile that is used as the input profile of a WBC system. Often times the pre-arranged position is a result of emitters configured in a mechanically fixed position. Pre-arranged and fixed position may also be used interchangeably. Examples of fixed-position or pre-arranged optical systems are shown in FIGS. 5A-C.

Figure 5A:
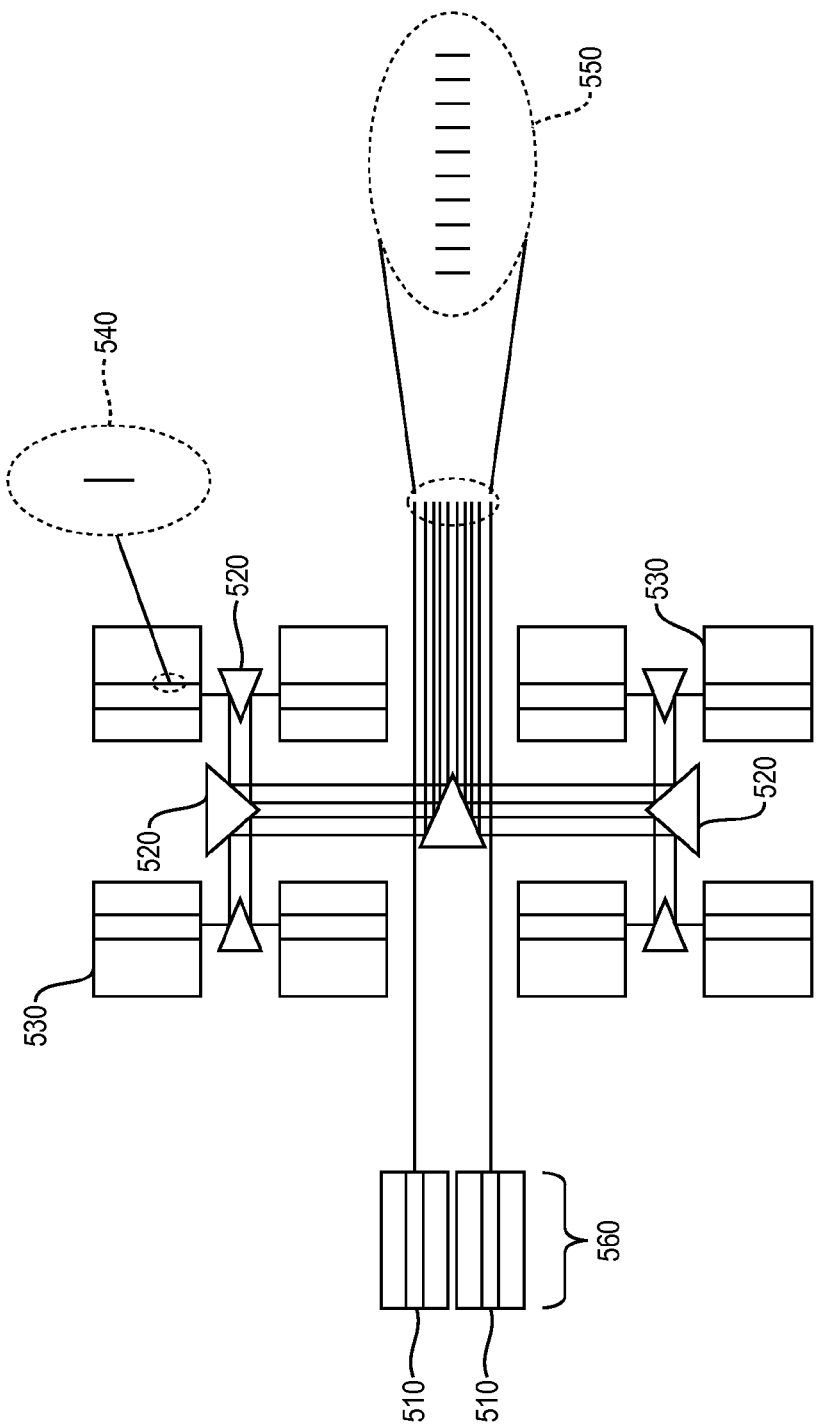
FIGS. 5A-C illustrate related methods for placing combining elements to generate one-dimensional or two-dimensional laser elements
Figure 5B:
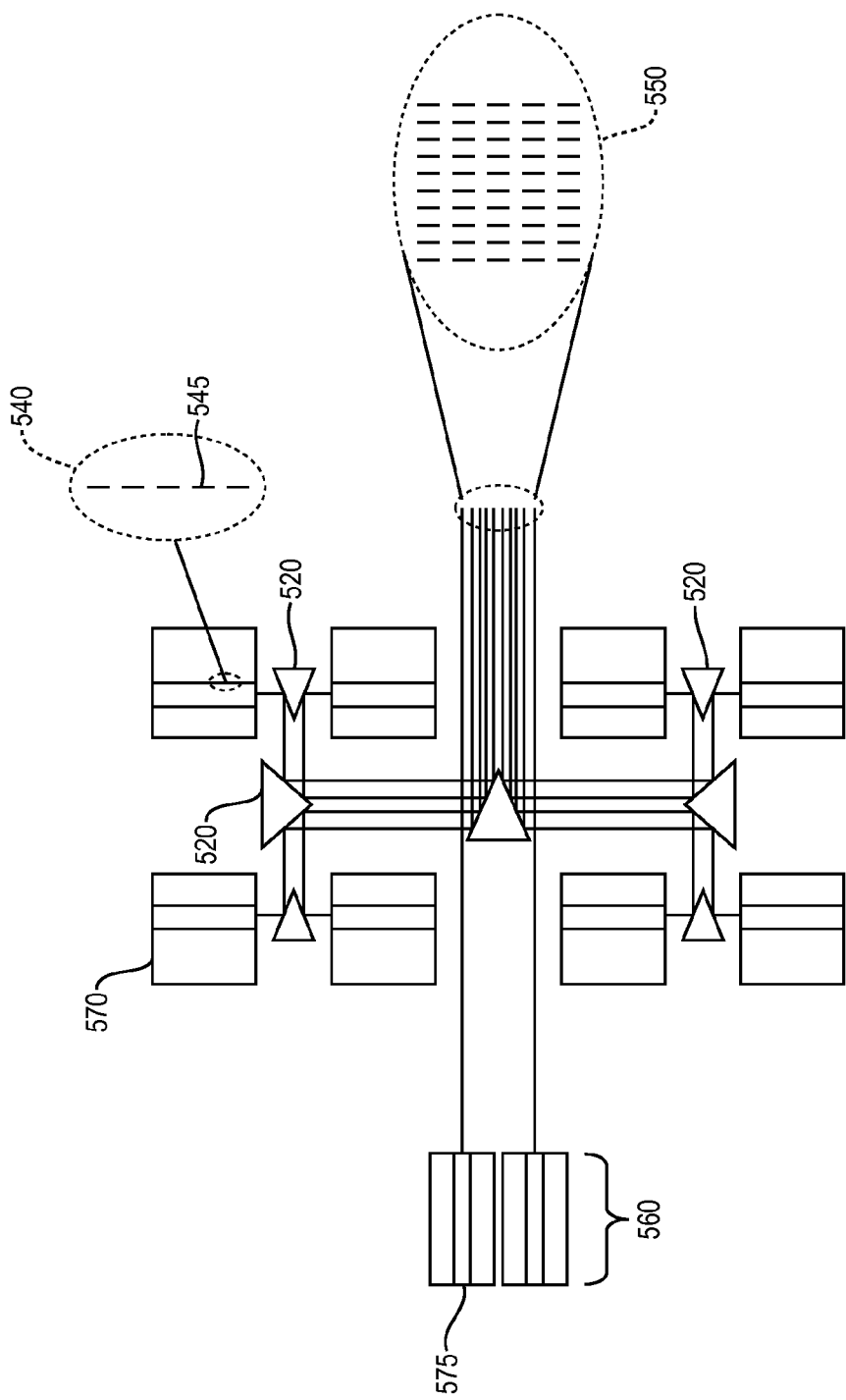
Figure 5C:
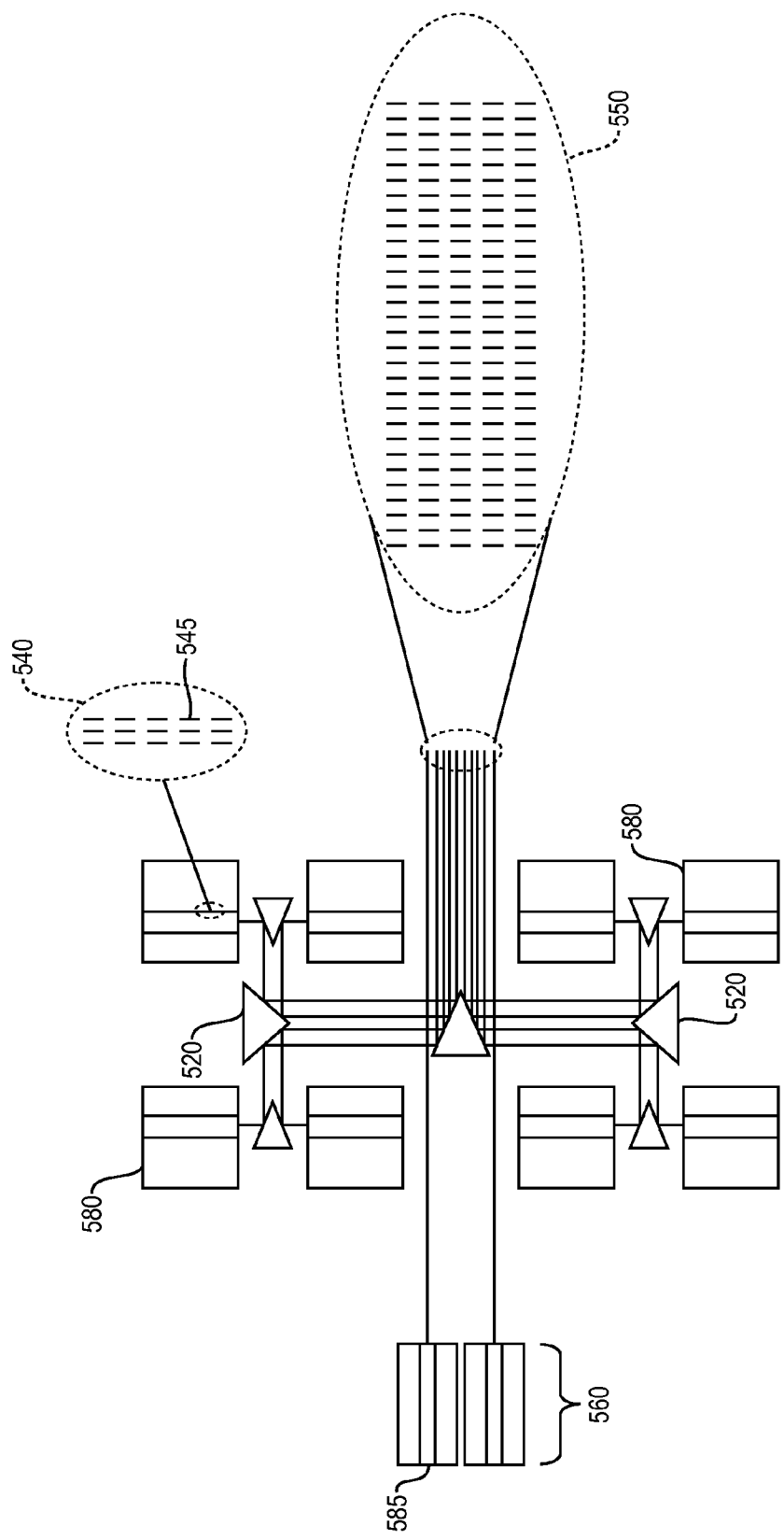

FIGS. 5A-5C refer to prior art illustrated examples of optically arranged one and two-dimensional arrays. FIG. 5A illustrates an optically arranged stack of individual optical elements 510. Mirrors 520 are used to arrange the optical beams from optical elements 530, each optical element 530 having a near field image 540, to produce an image 550 (which includes optical beams from each optical element 530) corresponding to a stack 560 (in the horizontal dimension) of the individual optical elements 510. Although the optical elements 500 may not be arranged in a stack, the mirrors 520 arrange the optical beams such that the image 550 appears to correspond to the stack 560 of optical elements 510. Similarly, in FIG. 5B, the mirrors 520 can be used to arrange optical beams from diode bars or arrays 570 to create an image 550 corresponding to a stack 560 of diode bars or arrays 575. In this example, each diode bar or array 570 has a near field image 540 that includes optical beams 545 from each individual element in the bar or array. Similarly, the mirrors 520 may also be used to optically arrange laser stacks 580 into an apparent larger overall stack 560 of individual stacks 585 corresponding to image 550, as shown in FIG. 5C.

Nomenclature, used in prior art to define the term "array dimension," referred to one or more laser elements placed side by side where the array dimension is along the slow diverging axis. One reason for this nomenclature is diode bars with multiple emitters are often arranged in this manner where each emitter is aligned side by side such that each beam's slow dimension is along a row or array. For purposes of this application, an array or row refers to individual emitters or beams arranged across a single dimension. The individual slow or fast dimension of the emitters of the array may also be aligned along the array dimension, but this alignment is not to be assumed. This is important because some embodiments described herein individually rotate the slow dimension of each beam aligned along an array or row. Additionally, the slow axis of a beam refers to the wider dimension of the beam as emitted at the facet of an emitter and is typically also the slowest diverging dimension, while the fast axis refers to the narrower dimension of the beam and is typically the fastest diverging dimension. The slow axis may also refer to single mode beams.

Additionally, some prior art defines the term "stack or stacking dimension" referred to as two or more arrays stacked together, where the beams' fast dimension is the same as the stacking dimension. These stacks were pre-arranged mechanically or optically. However, for purposes of this application a stack refers to a column of beams or laser elements and may or may not be along the fast dimension. Particularly, as discussed above, individual beams or elements may be rotated within a stack or column.

In some embodiments it is useful to note that the array dimension and the slow dimension of each emitted beam may be initially oriented across the same axis; however, the slow dimension of each emitted beam, as described in this application, may be initially (or become) oriented at an offset angle with respect to the array dimension. The slow dimension of each of the emitted beams may also be offset from each other at an angle. In other embodiments, only a portion of the emitters arranged along the array dimension are perfectly aligned along the same axis. For example, the array dimension of a diode bar may have emitters arranged along the array dimension, but because of smile (often a deformation or bowing of the bar) individual emitters' slow emitting dimension is slightly skewed or offset from the array dimension (see FIG. 2).

Laser sources based on common "commercial off-the-shelf" or COTS high power laser diode arrays and stacks are based on broad-area semiconductor or diode laser elements. Typically, the beam quality of these elements is diffraction-limited along the fast axis and many times diffraction-limited along the slow axis of the laser elements. It is to be appreciated that although the following discussion may refer primarily to single emitter laser diodes, diode laser bars and diode laser stacks, embodiments of the invention are not limited to semiconductor or laser diodes and may be used with many different types of laser and amplifier emitters, including fiber lasers and amplifiers, individually packaged diode lasers, other types of semiconductor lasers including quantum cascade lasers (QCLs), tapered lasers, ridge waveguide (RWG) lasers, distributed feedback (DFB) lasers, distributed Bragg reflector (DBR) lasers, grating coupled surface emitting laser, vertical cavity surface emitting laser (VCSEL), and other types of lasers and amplifiers.

All of the embodiments described herein can be applied to WBC of diode laser single emitters, bars, and stacks, and arrays of such emitters. In those embodiments employing stacking of diode laser elements, mechanical stacking or optical stacking approaches can be employed. In addition, where an HR coating is indicated at the facet of a diode laser element, the HR coating can be replaced by an AR coating, provided that external cavity optical components, including but not limited to a collimating optic and bulk HR mirror are used in combination with the AR coating. This approach is used, for example, with WBC of diode amplifier elements. Slow axis is also defined as the worse beam quality direction of the laser emission. The slow axis typically corresponds to the direction parallel to the semiconductor chip at the plane of the emission aperture of the diode laser element. Fast axis is defined as the better beam quality direction of the laser emission. Fast axis typically corresponds to the direction perpendicular to the semiconductor chip at the plane of the emission aperture of the diode laser element.

Figure 10:
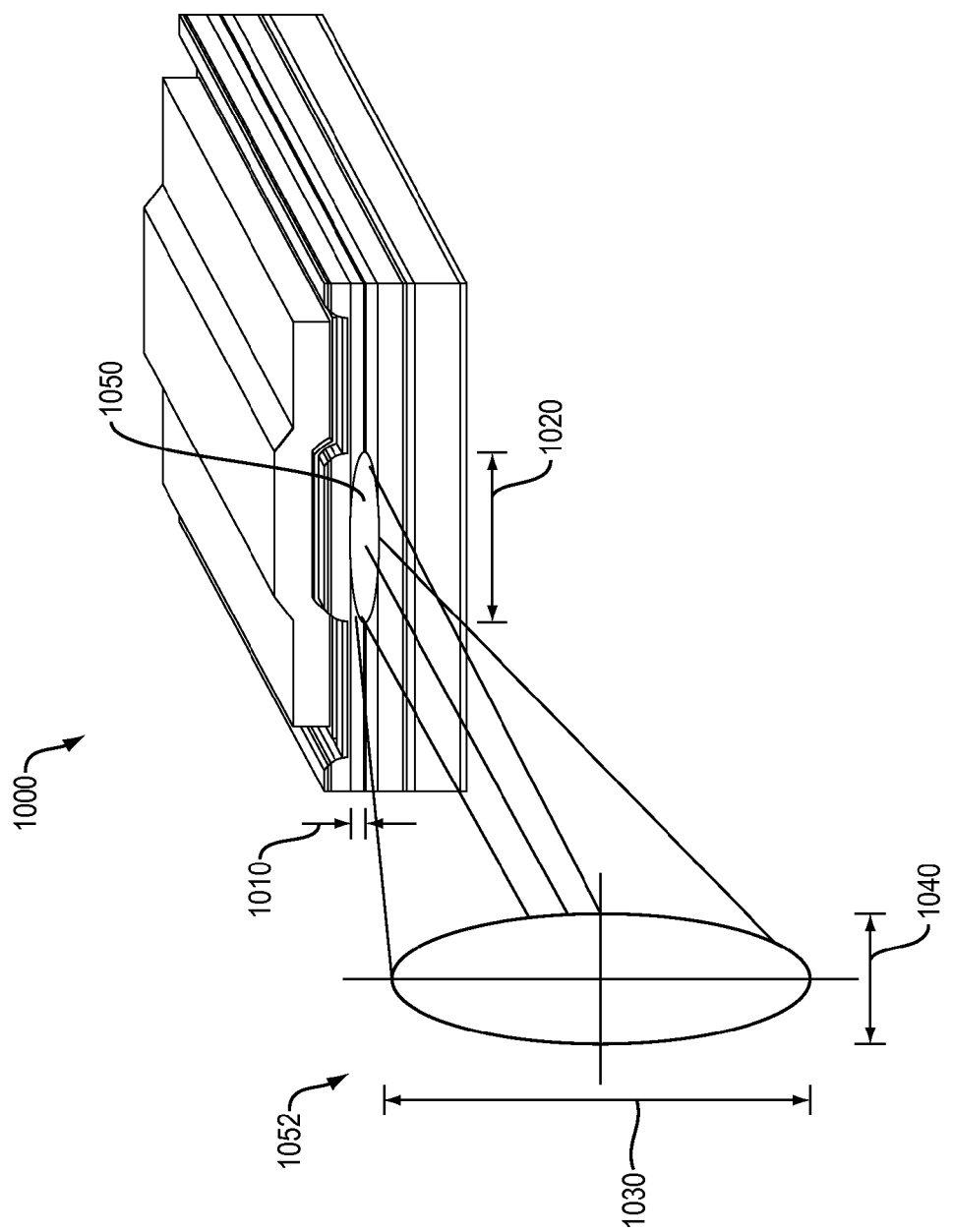
FIG. 10 is illustrative of a single semiconductor chip emitter.

An example of a single semiconductor chip emitter 1000 is shown in FIG. 10. The aperture 1050 is also indicative of the initial beam profile. Here, the height 1010 at 1050 is measured along the stack dimension. Width 1020 at 1050 is measured along the array dimension. Height 1010 is the shorter dimension at 1050 than width 1020. However, height 1010 expands faster or diverges to beam profile 1052, which is placed at a distance away from the initial aperture 1050. Thus, the fast axis is along the stack dimension. Width 1020 which expands or diverges at a slower rate as indicated by width 1040 being a smaller dimension than height 1030. Thus, the slow axis of the beam profile is along the array dimension. Though not shown, multiple single emitters such as 1000 may be arranged in a bar side by side along the array dimension.

Figure 2:
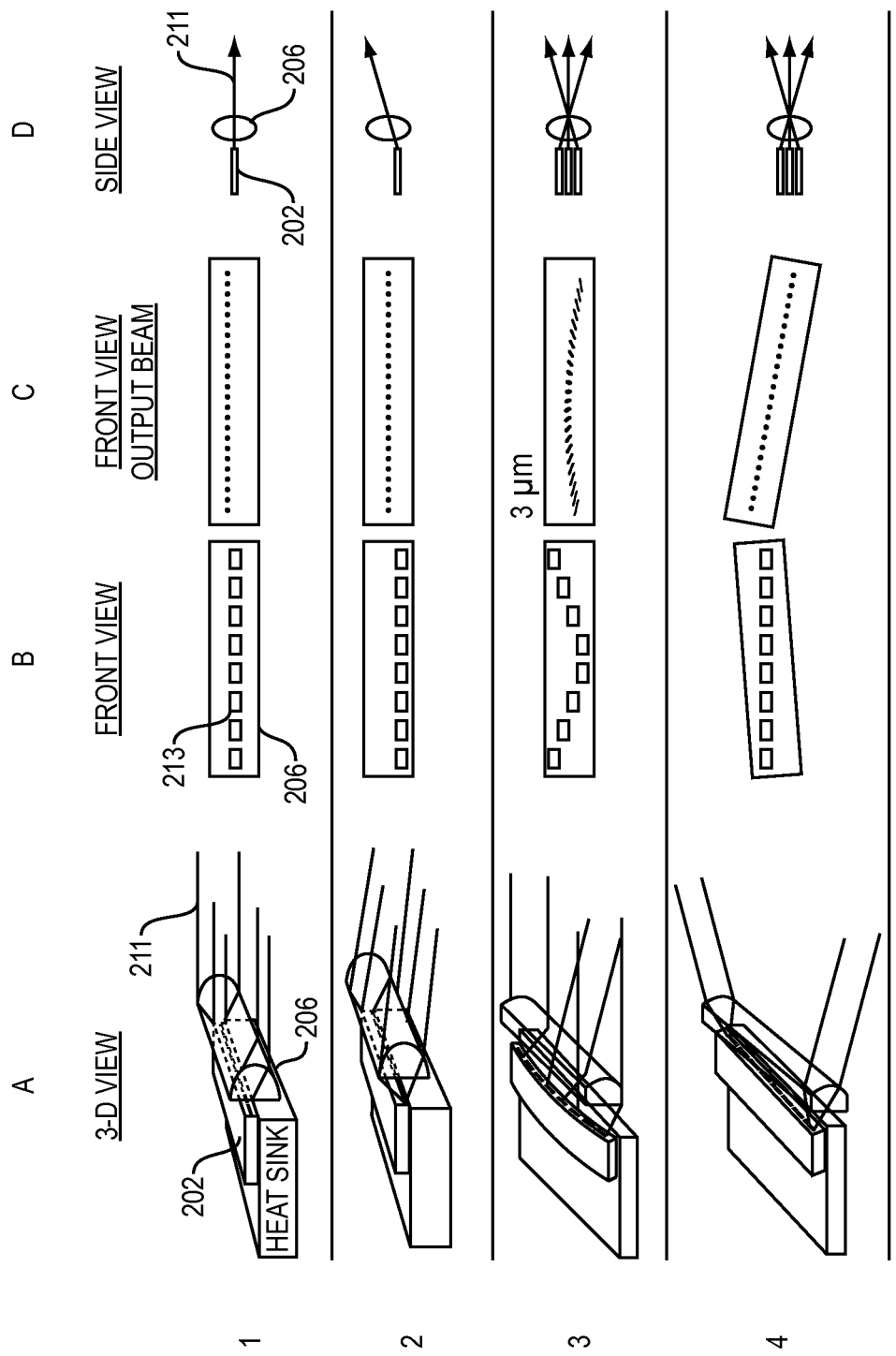
FIG. 2 is a schematic showing the effects of smile in a WBC method along the stack dimension of a two-dimensional array of diode laser emitters.

Drawbacks for combining beams primarily along their slow axis dimension may include: reduced power and brightness due to lasing inefficiencies caused by pointing errors, smile and other misalignments. As illustrated in FIG. 2, a laser diode array with smile, one often caused by the diode array being bowed in the middle sometimes caused by the diode laser bar mounting process, is one where the individual emitters along the array form a typical curvature representative of that of a smile. Pointing errors are individual emitters along the diode bar emitting beams at an angle other than normal from the emission point. Pointing error may be related to smile, for example, the effect of variable pointing along the bar direction of a diode laser bar with smile when the bar is lensed by a horizontal fast axis collimating lens. These errors cause feedback from the external cavity, which consists of the transform lens, grating, and output coupler, not to couple back to the diode laser elements. Some negative effects of this mis-coupling are that the WBC laser breaks wavelength lock and the diode laser or related packaging may be damaged from mis-coupled or misaligned feedback not re-entering the optical gain medium. For instance the feedback may hit some epoxy or solder in contact or in close proximity to a diode bar and cause the diode bar to fail catastrophically.

Row 1 of FIG. 2 shows a single laser diode bar 202 without any errors. The embodiments illustrated are exemplary of a diode bar mounted on a heat sink and collimated by a fast-axis collimation optic 206. Column A shows a perspective or 3-D view of the trajectory of the output beams 211 going through the collimation optic 206. Column D shows a side view of the trajectory of the emitted beams 211 passing through the collimation optic 206. Column B shows the front view of the laser facet with each individual laser element 213 with respect to the collimation optic 206. As illustrated in row 1, the laser elements 213 are perfectly straight. Additionally, the collimation optic 206 is centered with respect to all the laser elements 213. Column C shows the expected output beam from a system with this kind of input. Row 2 illustrates a diode laser array with pointing error. Shown by column B of row 2 the laser elements and collimation optic are slightly offset from each other. The result, as illustrated, is the emitted beams having an undesired trajectory that may result in reduced lasing efficiency for an external cavity. Additionally, the output profile may be offset to render the system ineffective or cause additional modifications. Row 3 shows an array with packaging error. The laser elements no longer sit on a straight line, and there is curvature of the bar. This is sometimes referred to as 'smile.' As shown on row 3, smile can introduce even more trajectory problems as there is no uniform path or direction common to the system. Column D of row 3 further illustrates beams 211 exiting at various angles. Row 4 illustrates a collimation lens unaligned with the laser elements in a twisted or angled manner. The result is probably the worst of all as the output beams generally have the most collimation or twisting errors. In most systems, the actual error in diode arrays and stacks is a combination of the errors in rows 2, 3, and 4. In both methods 2 and 3, using VBG's and diffraction gratings, laser elements with imperfections result in output beams no longer pointing parallel to the optical axis. These off optical axis beams result in each of the laser elements lasing at different wavelengths. The plurality of different wavelengths increases the output spectrum of the system to become broad as mentioned above.

One of the advantages of performing WBC along the stacking dimension (here also primarily the fast dimension) of a stack of diode laser bars is that it compensates for smile as shown in FIG. 2. Pointing and other alignment errors are not compensated by performing WBC along the array dimension (also primarily slow dimension). A diode bar array may have a range of emitters typically from 19 to 49 or more. As noted, diode bar arrays are typically formed such that the array dimension is where each emitter's slow dimension is aligned side by side with the other emitters. As a result, when using WBC along the array dimension, whether a diode bar array has 19 or 49 emitters (or any other number of emitters), the result is that of a single emitter. By contrast, when performing WBC along the orthogonal or fast dimension of the same single diode bar array, the result is each emitted beam increases in spectral brightness, or narrowed spectral bandwidth, but there is not a reduction in the number of beams (equivalently, there is not an increase in spatial brightness).

Figure 8:
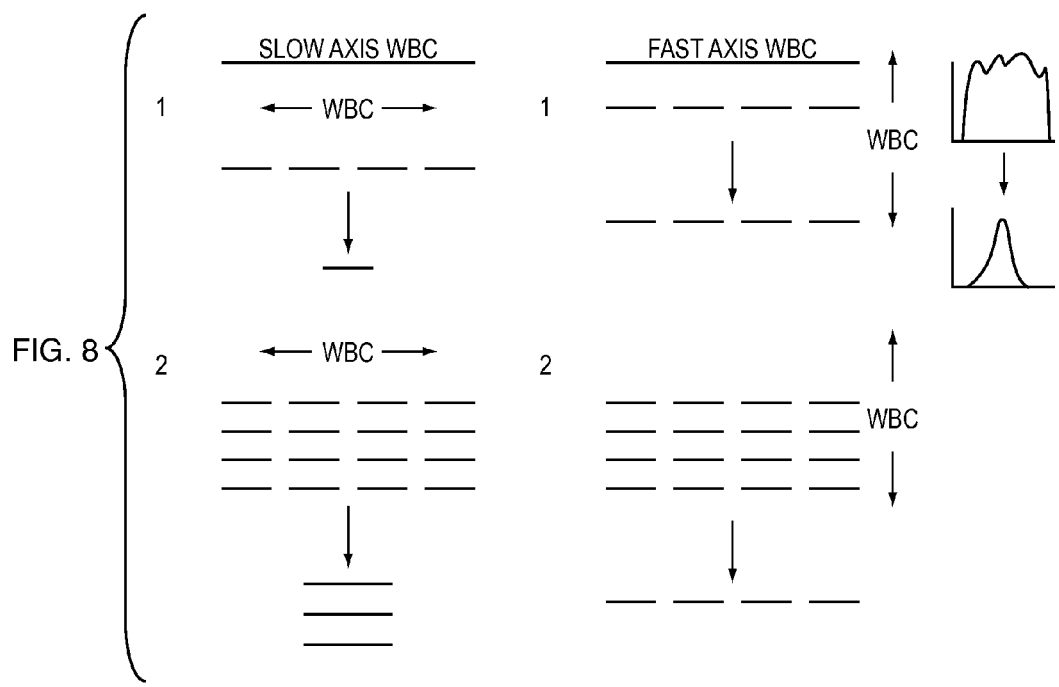
FIG. 8 illustrates the difference between slow and fast WBC.

This point is illustrated in FIG. 8. On the left of FIG. 8 is shown a front view of an array of emitters 1 and 2 where WBC along the slow dimension is being performed. Along the right side using the same arrays 1 and 2, WBC along the fast dimension is being performed. When comparing array 1, WBC along the slow dimension reduces the output profile to that of a single beam, while WBC along the fast dimension narrows the spectral bandwidth, as shown along the right side of array 1, but does not reduce the output profile size to that of a single beam.

Using COTS diode bars and stacks the output beam from beam combining along the stack dimension is usually highly asymmetric. Symmetrization, or reducing the beam profile ratio closer to equaling one, of the beam profile is important when trying to couple the resultant output beam profile into an optical fiber. Many of the applications of combining a plurality of laser emitters require fiber coupling at some point in an expanded system. Thus, having greater control over the output profile is another advantage of the application.

Further analyzing array 2 in FIG. 8 shows the limitation of the number of emitters per laser diode array that is practical for performing WBC along the fast dimension if very high brightness symmetrization of the output profile is desired. As discussed above, typically the emitters in a laser diode bar are aligned side by side along their slow dimension. Each additional laser element in a diode bar is going to increase the asymmetry in the output beam profile. When performing WBC along the fast dimension, even if a number of laser diode bars are stacked on each other, the resultant output profile will still be that of a single laser diode bar. For example if one uses a COTS 19-emitter diode laser bar, the best that one can expect is to couple the output into a 100 µm/0.22 NA fiber. Thus, to couple into a smaller core fiber lower number of emitters per bar is required. One could simply fix the number of emitters in the laser diode array to 5 emitters in order to help with the symmetrization ratio; however, fewer emitters per laser diode bar array generally results in an increase of cost of per bar or cost per Watt of output power. For instance, the cost of diode bar having 5 emitters may be around $2,000 whereas the cost of diode bar having 49 emitters may be around roughly the same price. However, the 49 emitter bar may have a total power output of up to an order-of-magnitude greater than that of the 5 emitter bar. Thus, it would be advantageous for a WBC system to be able to achieve a very high brightness output beams using COTS diode bars and stacks with larger number of emitters. An additional advantage of bars with larger number of emitters is the ability to de-rate the power per emitter to achieve a certain power level per bar for a given fiber-coupled power level, thereby increasing the diode laser bar lifetime or bar reliability.

Figure 3A:
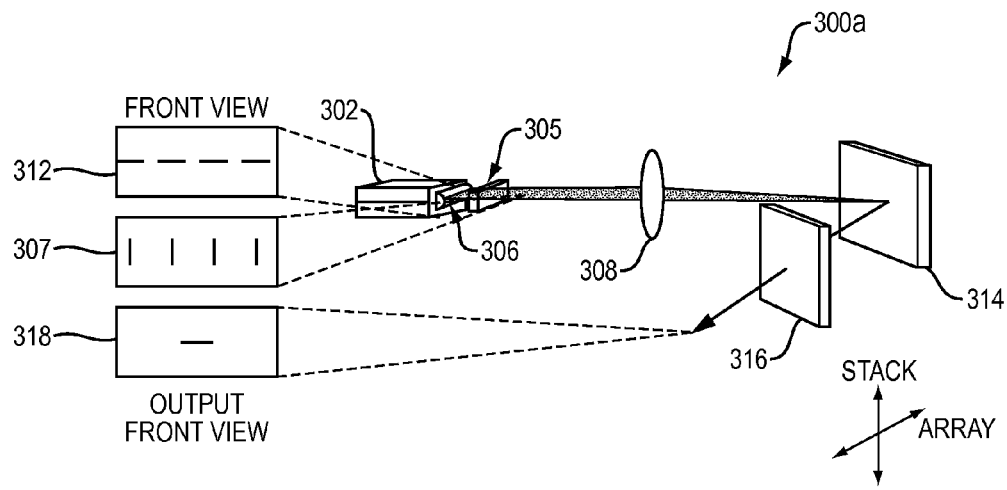
FIG. 3A is a schematic of a WBC system including an optical rotator selectively rotating a one-dimensional array of beams.

One embodiment that addresses this issue is illustrated in FIG. 3A, which shows a schematic of WBC system 300a with an optical rotator 305 placed after collimation lenses 306 and before the transform optic 308. It should be noted the transform optic 308 may be comprised of a number of lenses or mirrors or other optical components. The optical rotator 305 individually rotates the fast and slow dimension of each emitted beam shown in the input front view 312 to produce the re-oriented front view 307. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 318 as a single emitter. Dispersive element 314 is shown as a reflection diffraction grating, but may also be a dispersive prism, a grism (prism+grating), transmission grating, and Echelle grating. This particular embodiment illustrated shows only four laser emitters; however, as discussed above this system could take advantage of a laser diode array that included many more elements, e.g., 49. This particular embodiment illustrated shows a single bar at a particular wavelength band (example at 976 nm) but in actual practice it can be composed of multiple bars, all at the same particular wavelength band, arranged side-by-side. Furthermore, multiple wavelength bands (example 976 nm, 915 nm, and 808 nm), with each band composing of multiple bars, can we combined in a single cavity. When WBC is performed across the fast dimension of each beam it is easier to design a system with higher brightness (higher efficiency due to insensitivity due to bar imperfections); additionally, narrower bandwidth and higher power output are all achieved. As previously discussed it should noted some embodiments WBC system 300a may not include output coupler 316 and/or collimation lens(es) 306. Furthermore, pointing errors and smile errors are compensated for by combining along the stack dimension (In this embodiment this is also the fast dimension).

Figure 3B:
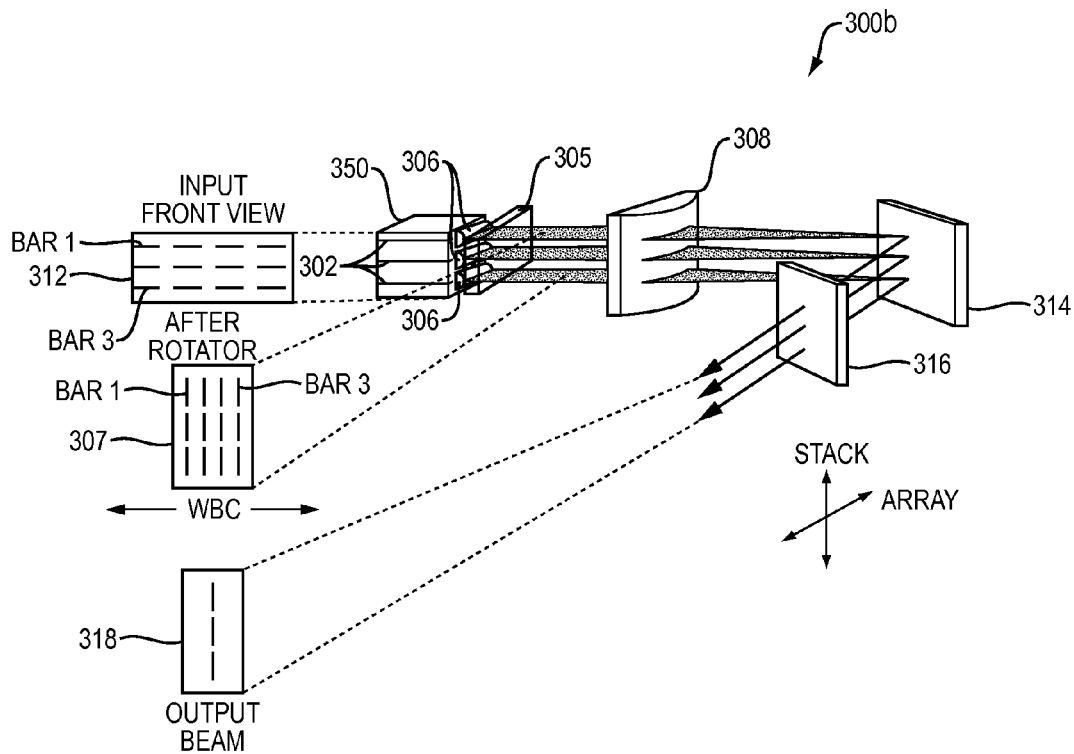
FIG. 3B is a schematic of a WBC system including an optical rotator selectively rotating a two-dimensional array of beams

FIG. 3B, shows an implementation similar to 3A except that a stack 350 of laser arrays 302 forms a 2-D input profile 312. Cavity 300b similarly consists of collimation lens(es) 306, optical rotator 305, transform optic 308, dispersive element 308 (here a diffraction grating), and an output coupler 316 with a partially reflecting surface. Each of the beams is individually rotated by optical rotator 305 to form an after rotator profile 307. The WBC dimension is along the array dimension, but with the rotation each of the beams will be combined across their fast axis. Fast axis WBC produces outputs with very narrow line widths and high spectral brightness. These are usually ideal for industrial applications such as welding. After transform optic 308 overlaps the rotated beams onto dispersive element 314 a single output profile is produced and partially reflected back through the cavity into the laser elements. The output profile 318 is now comprised of a line of three (3) beams that is quite asymmetric.

Figure 3C:
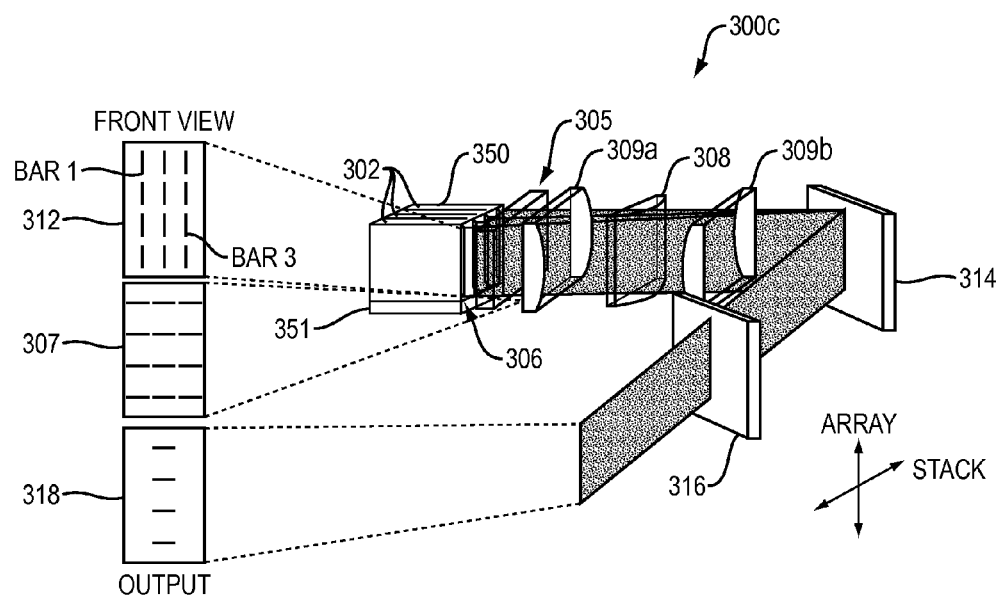
FIG. 3C is a schematic of a WBC system including an optical rotator selectively reorienting a two-dimensional array of beams.

FIG. 3C shows another implementation of selective beam rotation when applied to 2-D array of laser elements. The system consists of 2-D array laser elements 302, optical rotator 305, transform optical system (308 and 309a-b), a dispersive element 314, and a partially reflecting mirror 316. FIG. 3C illustrates a stack 350 of laser diode bars 302 with each bar having an optical rotator 305. Each of the diode bars 302 (three total) as shown in external cavity 300c includes four emitters. After input front view 312 is reoriented by optical rotator 305, reoriented front view 307 now the slow dimension of each beam is aligned along the stack dimension. WBC is performed along the stack dimension, which is now the slow axis of each beam and the output front view 318 now comprises single column of beams with each beam's slow dimension oriented along the stack dimension. Optic 309a and 309b provide a cylindrical telescope to image along the array dimension. The arrangement of the three cylindrical lenses is to provide two main functions. The middle cylindrical lens is the transform lens and its main function is to overlap all the beams onto the dispersive element. The two other cylindrical lenses 309a and 309b form an afocal cylindrical telescope along the non-beam combining dimension. Its main function is to make sure all laser elements along the non-beam combining are propagation normal to the partially reflecting mirror. As such the implementation as shown in FIG. 3C has the same advantages as the one shown in FIG. 1C. However, unlike the implementation as shown in FIG. 1C the output beam is not the same as the input beam. The number of emitters in the output beam 318 in FIG. 3C is the same as the number of bars in the stack. For example, if the 2-D laser source consists of a 3-bar stack with each bar composed of 49 emitters, then the output beam in FIG. 1C is a single bar with 49 emitters. However, in FIG. 3C the output beam is a single bar with only 3 emitters. Thus, the output beam quality or brightness is more than one order of magnitude higher. This brightness improvement is very significant for fiber-coupling. For higher power and brightness scaling multiple stacks can be arranged side-by-side.

To illustrate this configuration further, for example, assume WBC is to be performed of a 3-bar stack, with each bar comprising of 19 emitters. So far, there are three options. First, wavelength beam combining can be performed along the array dimension to generate 3 beams as shown in FIG. 1B. Second, wavelength beam combining can be performed along the stack dimension to generate 19 beams a shown FIG. 1C. Third, wavelength beam combining can be performed along the array dimension using beam rotator to generate 19 beams as shown FIG. 3C. There are various trade-offs for all three configuration. The first case gives the highest spatial brightness but the lowest spectral brightness. The second case gives the lowest spatial brightness with moderate spectral brightness and beam symmetrization is not required to couple into a fiber. The third case gives the lowest spatial brightness but the highest spectral brightness and beam symmetrization is required to couple into an optical fiber. In some applications this is more desirable.

Figure 3D:
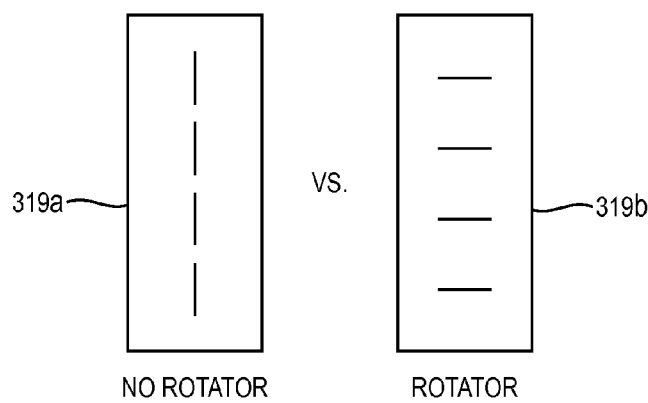
FIG. 3D illustrates output profile views of the system of FIG. 3C with and without an optical rotator.

To illustrate the reduction in asymmetry FIG. 3D has been drawn showing the final output profile 319*a* where the system of 300*b* did not have an optical rotator and output profile 319*b* where the system includes an optical rotator. Though these figures are not drawn to scale, they illustrate an advantage achieved by utilizing an optical rotator, in a system with this configuration where WBC is performed across the slow dimension of each beam. The shorter and wider 319*b* is more suitable for fiber coupling than the taller and slimmer 319*a*.

Figure 4A:
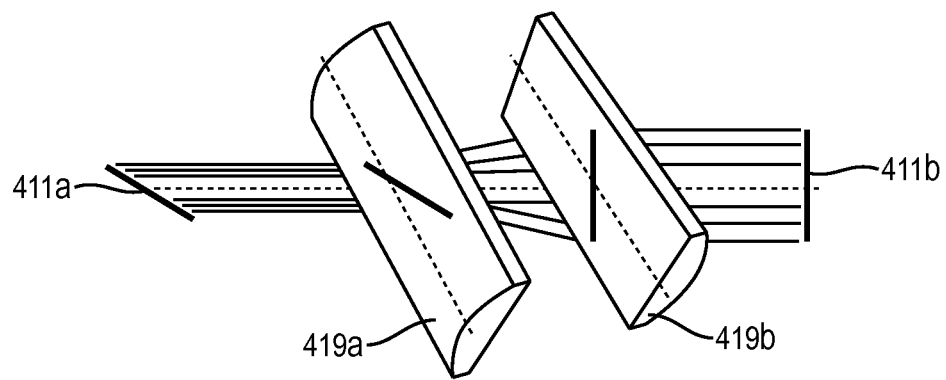
FIGS. 4A-C illustrate examples of optical rotators.
Figure 4B:
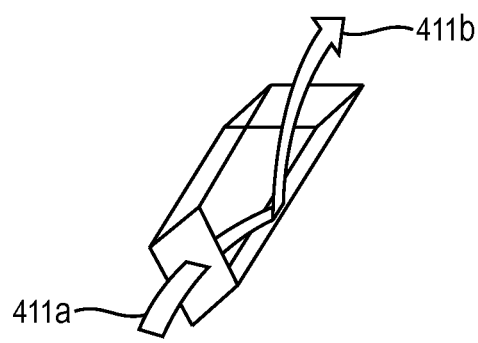
Figure 4C:
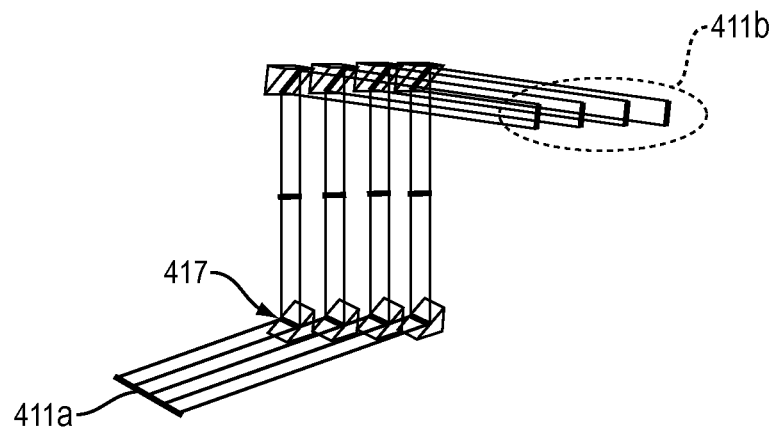

An example of various optical rotators is shown in FIGS. 4A-C. FIG. 4A illustrates an array of cylindrical lenses (419*a* and 419*b*) that cause input beam 411*a* to be rotated to a new orientation at 411*b*. FIG. 4B similarly shows input 411*a* coming into the prism at an angle, which results in a new orientation or rotation beam 411*b*. FIG. 4C illustrates an embodiment using a set of step mirrors 417 to cause input 411*a* to rotate at an 80-90 degree angle with the other input beams resulting in a new alignment of the beams 411*b* where they are side by side along their respective fast axis. These devices and others may cause rotation through both non-polarization sensitive as well as polarization sensitive means. Many of these devices become more effective if the incoming beams are collimated in at least the fast dimension. It is also understand that the optical rotators can selectively rotate the beams at various including less than 90 degrees, 90 degrees and greater than 90 degrees.

The optical rotators in the previous embodiments may selectively rotate individual, rows or columns, and groups of beams. In some embodiments a set angle of rotation, such as a range of 80-90 degrees is applied to the entire profile or subset of the profile. In other instances, varying angles of rotation are applied uniquely to each beam, row, column or subset of the profile. (see FIGS. 9A-B) For instance, one beam may be rotated by 45 degrees in a clockwise direction while an adjacent beam is rotated 45 degrees in a counter-clockwise direction. It is also contemplated one beam is rotated 10 degrees and another is rotated 70 degrees. The flexibility the system provides can be applied to a variety of input profiles, which in turn helps determine how the output profile is to be formed.

Figure 9B:
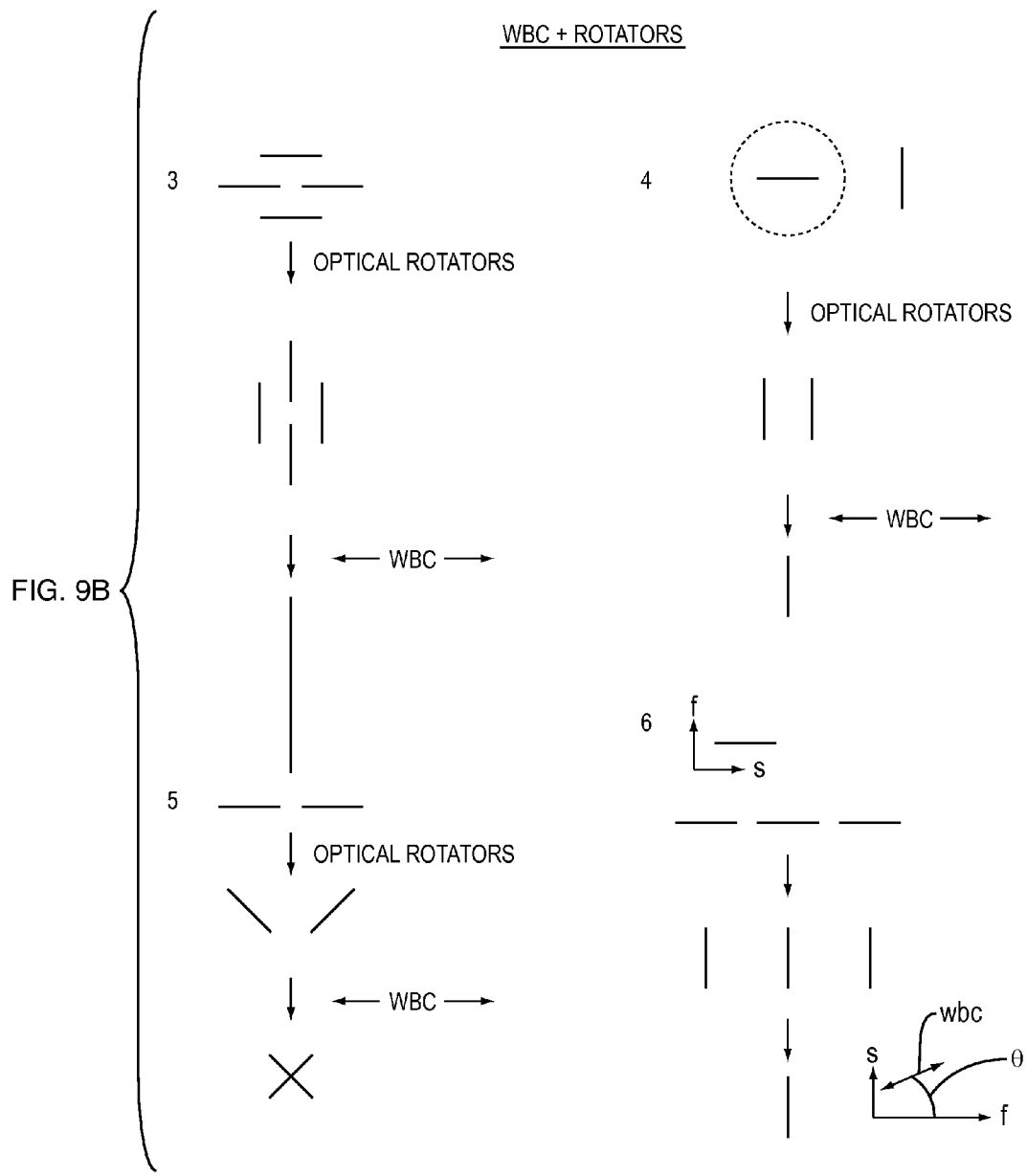
FIG. 9B illustrates additional embodiments using an optical rotator before WBC step.

Performing WBC along an intermediate angle between the slow and fast dimension of the emitted beams is also well within the scope of the invention (See for example 6 on FIG. 9B). Some laser elements as described herein produce electromagnetic radiation and include an optical gain medium. When the radiation or beams exit the optical gain portion they generally are collimated along the slow and/or fast dimension through a series of micro lenses. From this point, the embodiments already described in this section included an optical rotator that selectively and rotated each beam prior to the beams being overlapped by a transform lens along either the slow or the fast dimension of each beam onto a dispersive element. The output coupler may or may not be coated to partially reflect the beams back into the system to the laser element where the returned beams assist in generating more external cavity feedback in the optical gain element portion until they are reflected off a fully reflective mirror in the back portion of the laser element. The location of the optical elements listed above and others not listed are with respect to the second partially reflective surface helps decide whether the optical elements are within an external cavity system or outside of the lasing cavity. In some embodiments, not shown, the second partially reflective mirror resides at the end of the optical gain elements and prior to the collimating or rotating optics.

Figure 6:
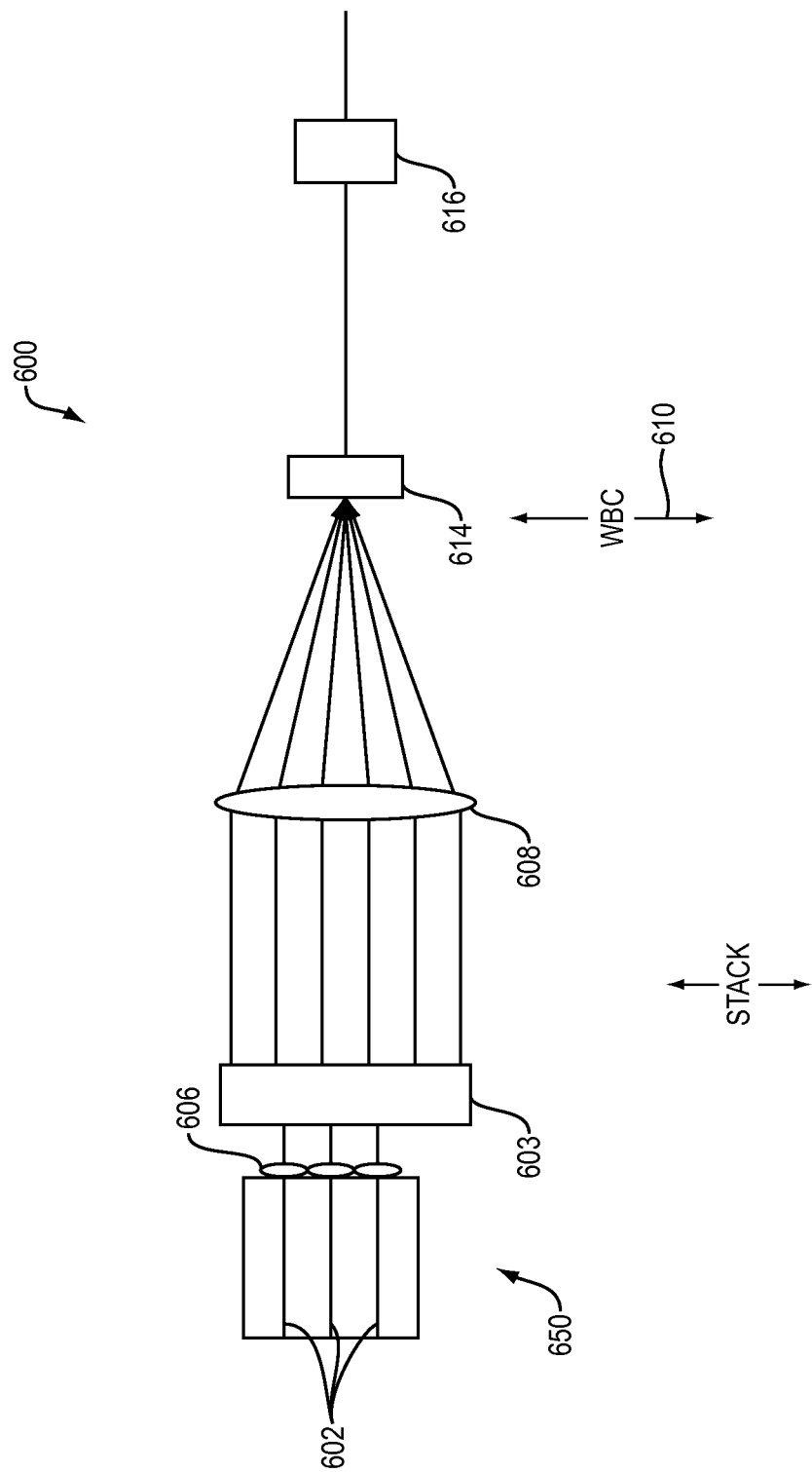
FIG. 6 illustrates a WBC embodiment having a spatial repositioning element.

Another method for manipulating beams and configurations to take advantage of the various WBC methods includes using a spatial repositioning element. This spatial repositioning element may be placed in an external cavity at a similar location as to that of an optical rotator. For example, FIG. 6 shows a spatial repositioning element 603 placed in the external cavity WBC system 600 after the collimating lenses 606 and before the transform optic(s) 608. The purpose of a spatial repositioning element is to reconfigure an array of elements into a new configuration. FIG. 6 shows a three-bar stack with N elements reconfigured to a six-bar stack with N/2 elements. Spatial repositioning is particularly useful in embodiments such as 600, where stack 650 is a mechanical stack or one where diode bar arrays 602 and their output beams were placed on top of each other either mechanically or optically. With this kind of configuration the laser elements have a fixed-position to one another. Using a spatial repositioning element can form a new configuration that is more ideal for WBC along the fast or slow dimension. The new configuration makes the output profile more suitable for fiber coupling.

Figure 7:
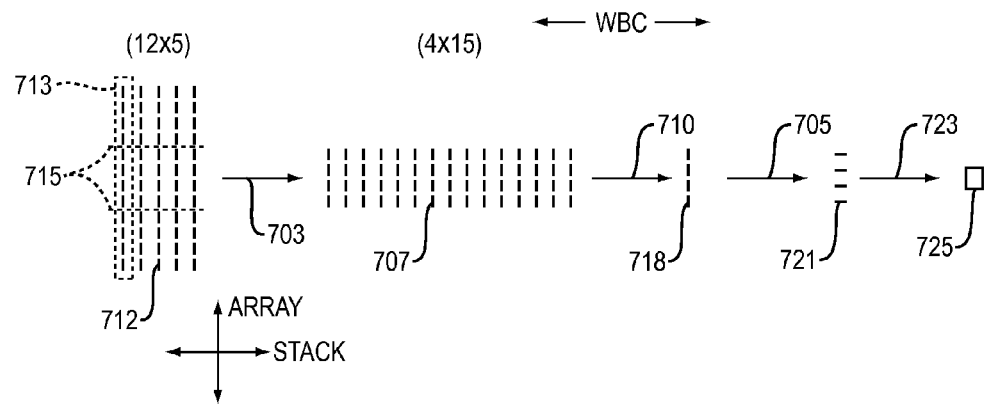
FIG. 7 illustrates an embodiment of a two-dimensional array of emitters being reconfigured before a WBC step within a laser cavity and individual beam rotation after the WBC step outside of the cavity.

For example, FIG. 7 illustrates an embodiment wherein front view of a two-dimensional array of emitters 712 is reconfigured during a spatial repositioning step 703 by a spatial repositioning optical element such as an array of periscope mirrors. The reconfigured array shown by reconfigured front view 707 is now ready for a WBC step 710 to be performed across the WBC dimension, which here is the fast dimension of each element. The original two-dimensional profile in this example embodiment 700 is an array of 12 emitters tall and 5 emitters wide. After the array is transmitted or reflected by the spatial repositioning element a new array of 4 elements tall and 15 elements wide is produced. In both arrays the emitters are arranged such that the slow dimension of each is vertical while the fast dimension is horizontal. WBC is performed along the fast dimension which collapses the 15 columns of emitters in the second array into 1 column that is 4 emitters tall as shown in front view 718. This output is already more symmetrical than if WBC had been performed on the original array, which would have resulted in a single column 15 emitters tall. As shown, this new output may be further symmetrized by an individually rotating step 705 rotating each emitter by 90 degrees. In turn, a post WBC front view 721 is produced being the width of a single beam along the slow dimension and stacked 4 elements high, which is a more suitable for coupling into a fiber.

One way of reconfiguring the elements in a one-dimensional or two-dimensional profile is to make 'cuts' or break the profile into sections and realign each section accordingly. For example, in FIG. 7 two cuts 715 were made in 713. Each section was placed side by side to form 707. These optical cuts can be appreciated if we note the elements of 713 had a pre-arranged or fixed-position relationship. It is also well within the scope to imagine any number of cuts being made to reposition the initial input beam profile. Each of these sections may in addition to being placed side by side, but on top and even randomized if so desired.

Spatial repositioning elements may be comprised of a variety of optical elements including periscope optics that are both polarized and non-polarized as well as other repositioning optics. Some examples are shown in FIGS. 4A-C, which may be configured to rotate, shift or reposition individual beams or groups of beams with respect to each other. Some of these repositioning elements include micro mirrors and lenses.

It is contemplated spatial repositioning elements and optical rotators may be used in the same external-cavity system or a combination of inside and outside of the cavity system. The order of which element appears first is not as important and is generally determined by the desired output profile.

Additional embodiments encompassing, but not limiting the scope of the invention, are illustrated in FIGS. 9A-B. The system shown in 1 of FIG. 9A shows a single array of 4 beams aligned side to side along the slow dimension. An optical rotator individually rotates each beam. The beams are then combined along the fast dimension and are reduced to a single beam by WBC. In this arrangement it is important to note that the 4 beams could easily be 49 or more beams. It may also be noted that if some of the emitters are physically detached from the other emitters, the individual emitter may be mechanically rotated to be configured in an ideal profile. A mechanical rotator may be comprised of a variety of elements including friction sliders, locking bearings, tubes, and other mechanisms configured to rotate the laser element. Once a desired position is achieved the laser elements may then be fixed into place. It is also conceived that an automated rotating system that can adjust the beam profile depending on the desired profile may be implemented. This automated system may either mechanically reposition a laser or optical element or a new optical element may be inserted in and out of the system to change the output profile as desired.

System 2 as shown in FIG. 9A, illustrates a two-dimensional array having 3 stacked arrays with 4 beams each aligned along the slow dimension. (Similar to FIG. 3C) As this stacked array passes through an optical rotator and WBC along the fast dimension a single column of 3 beams tall aligned top to bottom along the slow dimension is created. Again it is appreciated that if the three stacked arrays shown in this system had 50 elements, the same output profile would be created, albeit one that is brighter and has a higher output power.

System 3 in FIG. 9B, shows a diamond pattern of 4 beams wherein the beams are all substantially parallel to one another. This pattern may also be indicative of a random pattern. The beams are rotated and combined along the fast dimension, which results in a column of three beams aligned along the slow dimension from top to bottom. Missing elements of diode laser bars and stacks due to emitter failure or other reasons, is an example of System 3. System 4, illustrates a system where the beams are not aligned, but that one beam is rotated to be aligned with a second beam such that both beams are combined along the fast dimension forming a single beam. System 4, demonstrates a number of possibilities that expands WBC methods beyond using laser diode arrays. For instance, the input beams in System 4 could be from carbon dioxide ($CO_2$) lasers, semiconductor or diode lasers, diode pumped fiber lasers, lamp-pumped or diode-pumped Nd:YAG lasers, Disk Lasers, and so forth. The ability to mix and match the type of lasers and wavelengths of lasers to be combined is another advantage encompassed within the scope of this invention.

System 5, illustrates a system where the beams are not rotated to be fully aligned with WBC dimension. The result is a hybrid output that maintains many of the advantages of WBC along the fast dimension. In several embodiments the beams are rotated a full 90 degrees to become aligned with WBC dimension, which has often been the same direction or dimension as the fast dimension. However, System 5 and again System 6 show that optical rotation of the beams as a whole (System 6) or individually (System 5) may be such that the fast dimension of one or more beams is at an angle theta or offset by a number of degrees with respect to the WBC dimension. A full 90 degree offset would align the WBC dimension with the slow dimension while a 45 degree offset would orient the WBC dimension at an angle halfway between the slow and fast dimension of a beam as these dimension are orthogonal to each other. In one embodiment, the WBC dimension has an angle theta at approximately 3 degrees off the fast dimension of a beam.

Figure 11A:
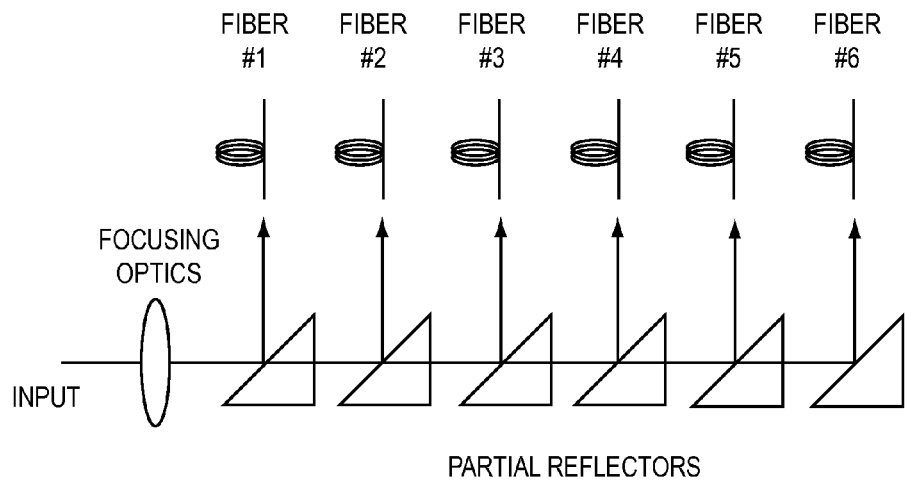
FIG. 11A is an optical schematic of a prior art multiple output beam system using partial reflectors.
Figure 11B:
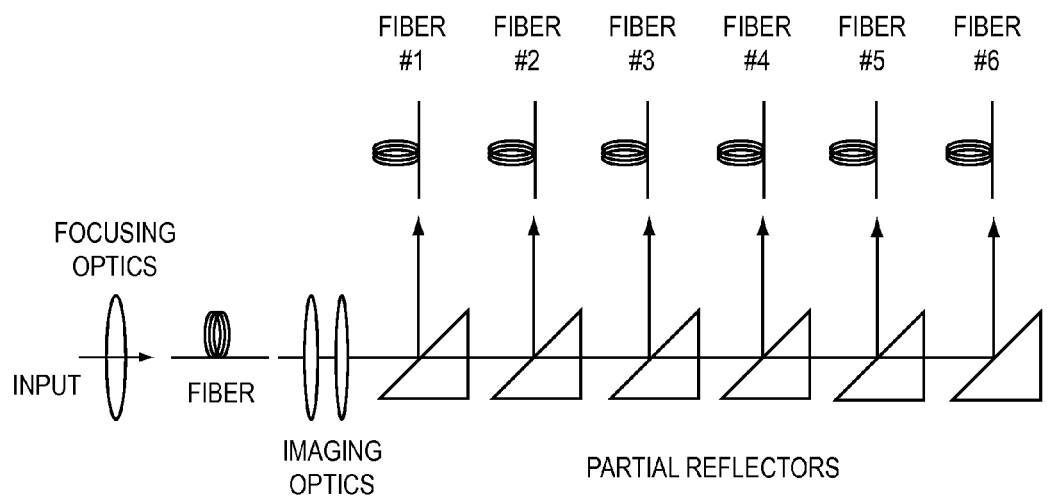
FIG. 11B is an optical schematic of another prior art multiple output beam system using partial reflectors.

As mentioned, previous methods used to create a multi-output beam system generally include apportioning single symmetrical beam by means of partially reflecting a portion of the beam to a desired area such as an optical fiber used for pumping a fiber laser. The remaining portion of the beam not reflected passes through the partial reflector onto another partial reflector, where the process is repeated until the entire beam has been apportioned and reflected to each desired area. Examples of these setups are illustrated in FIGS. 11A-B.

However, this method of using partial reflectors is more suited for symmetrical beams because of the coupling that occurs into an optical fiber. Asymmetric beam profiles require larger optical fiber inputs or symmetrization as previously discussed to optimally couple into an optical fiber. One of the inherent results of a WBC system is it produces asymmetric beam profiles. However it is desirable to have the advantages of WBC system which are capable of producing high brightness, efficient, robust, reliable, high-powered output.

The beam quality factor, or $M^2$, of a laser beam directly relates to the brightness of a beam as shown in the following equation:

$$B = \frac{P}{\lambda^2 (M_x^2)(M_y^2)}$$

where B equals the total brightness (or radiance), P equals power, λ is the wavelength of light emitted, and $M_x^2$ and $M_y^2$ are the beam quality factors in the x and y directions, respectively. A laser beam is often said to be "$M^2$ times diffraction-limited", indicating that the beam quality parameter M2 corresponds approximately to the multiple of times that a beam is diffraction limited. A diffraction-limited beam has an $M^2$ factor of 1, and is generally a Gaussian beam. Smaller values of $M^2$ are physically not possible. The $M^2$ factor of a laser beam limits the degree to which the beam can be focused for a given beam divergence angle, which is often limited by the numerical aperture of the focusing lens. Together with the optical power P, the beam quality factor determines the brightness B (more precisely, the radiance) of a laser beam. For non-circularly symmetric beams, the $M^2$ factor can be different for two directions orthogonal to the beam axis and to each other (x,y). This is particularly the case for the output of diode laser bars, where the $M^2$ factor is usually fairly low for the fast axis (y axis) and usually much higher for the slow axis (x axis).

Symmetrizing a beam or an array of combined emitters refers to the process in which the aspect ratio of $M_x^2:M_y^2$ or $(M_y^2:M_x^2)$ is reduced, or made closer to 1:1. For example in one embodiment an array or bar is comprised of a single row of 19 emitters having beam quality different in the x and y directions, $M_x^2$ with a value of 211 and $M_y^2$ with a value of 1. A number of arrays of this type (for example, 30 arrays) may be combined by wavelength beam combination (WBC) along the fast axis, and the output beam after WBC corresponds optically to that of a single bar having $M_x^2$ with a value of 211 and $M_y^2$ with a value of 1. The objective is to couple the output beam into an optical fiber having a beam quality where $M_x^2=M_y^2=40$. To accomplish this objective, the output beam may be symmetrized, for example, by using a beam rotating optical component or selective repositioning optical component, to reduce the aspect ratio of the beam to 15:15 (or equivalently, 1:1), in which the profile has beam quality $M_x^2=M_y^2=15$ sufficient for coupling into the optical fiber with $M^2=40$. Thus, symmetrizing in this example caused the aspect ratio $M_x^2:M_y^2$ to be reduced from 211:1 to 15:15 (equivalent to 1:1). Note that in this example, the overall brightness is conserved in the symmetrization process, while the aspect ratio of $M_x^2:M_y^2$ is reduced considerably. Other examples of beam symmetrizing may include other forms of redistributing the aspect ratio $M_x^2:M_y^2$ to make the aspect ratio lower or more symmetric.

Another aspect of symmetrizing may result in the reduction of the divergence in one or both axes, thus enabling optical elements focusing the particular beam or profile to have a smaller numerical aperture.

One of the advantages of a WBC system is it readily utilizes diode laser bars to increase the overall power of the system, P, while combining beams along their respective slow or fast axis thus reducing the $M^2$ number in at least one direction, thus increasing the total brightness output. However, when combining multiple emitters aligned side by side or in any other configuration, there is often an associated fill factor number that reduces the total brightness of the output.

The following embodiments address additional systems and methods for apportioning and symmetrizing multi-wavelength beams produce by WBC methods for optical coupling into multiple optical fibers or other distinct locations.

Figure 12A:
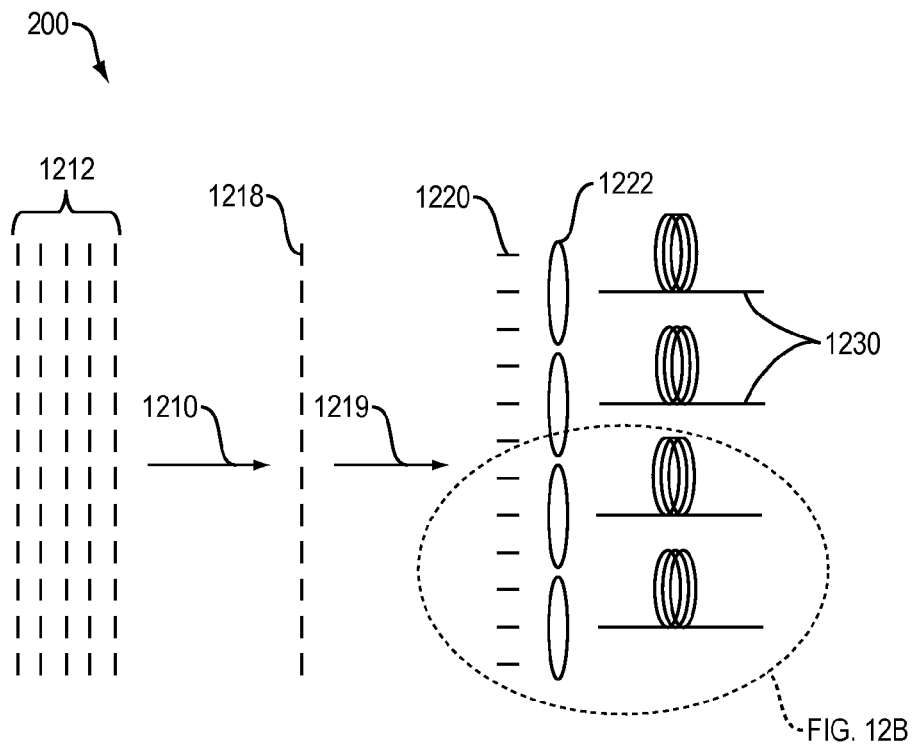
FIGS. 12A-B illustrate an optical schematic embodiment apportioning and coupling a multi-beam asymmetric output, formed by a WBC method, into multiple optical fibers using multiple lenses.
Figure 12B:
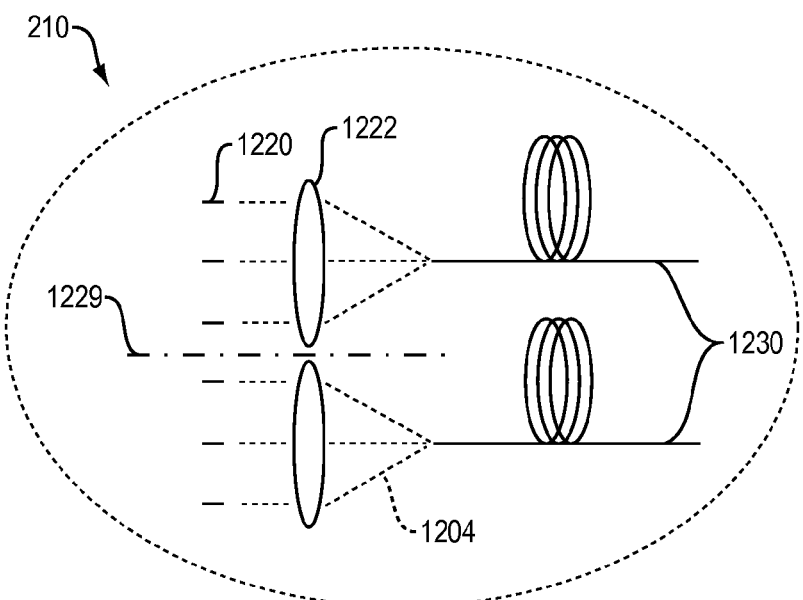

For example, the multiple output beam system shown in FIGS. 12A-B illustrates an optical schematic embodiment apportioning and coupling a multi-beam asymmetric output, formed by a WBC method, into multiple optical fibers using multiple lenses. The initial beam inputs shown in front view 1212 illustrates a 5×12 array of beams configured to be combined along the fast axis of each beam. This array could be formed by 5 stacks of diode laser bars with each bar having 12 emitters. A WBC method 1210 is performed along the fast axis of each beam and produces the tall skinny profile shown in front view 1218, where the initial input array has been reduce to a 1×12 array. A symmetrization step 1219, such as those described above, may then be applied to individually rotate portions of the beam to produce a more symmetrized output as shown by front view 1220 where the ratio between the two orthogonal axis or $M^2$ number is now closer to one as compared to the profile illustrated by initial combined profile in front view 1218. Multiple optical elements 1222 now apportion and direct each sub-portion of profile 1220 into another optical system such as an optical fiber laser 1230. Optical elements 1222 may include transmissive or refractive lenses, reflective mirrors, or other equivalent optics configured to apportion a section of the asymmetrical output beam profile 1220 and direct that section or portion into/onto another desired area. An enlarged cutout section 1202 of the optical schematic 1200 further illustrates this apportioning and directing process. Apportionment line 1229 shows an arbitrary boundary that divides part of the profile 1220 into individual sections or portions. Optical trace lines 1204 illustrate the path each section takes as optical element 1222 directs each section into another location, such as an optical fiber or the fiber laser system 1230 shown.

As previously described the brightness of these output profiles emitted by a WBC or other beam combining system is reduced by the fill factor number. By apportioning the asymmetrical output beam profile 1220 as shown in FIGS. 12A-B through use of optical elements 1222, the fill factor number may be preserved or some cases reduced wherein the sum total brightness of each of the apportioned sections is now equal to or greater than the original output profile 1220. In addition the optical coupling of each apportioned section into another optical system such as a fiber laser can now be performed with optical elements having lower numerical apertures because the symmetrization ratio or $M^2$ number of the apportioned sections is now closer to one (1).

Figure 13A:
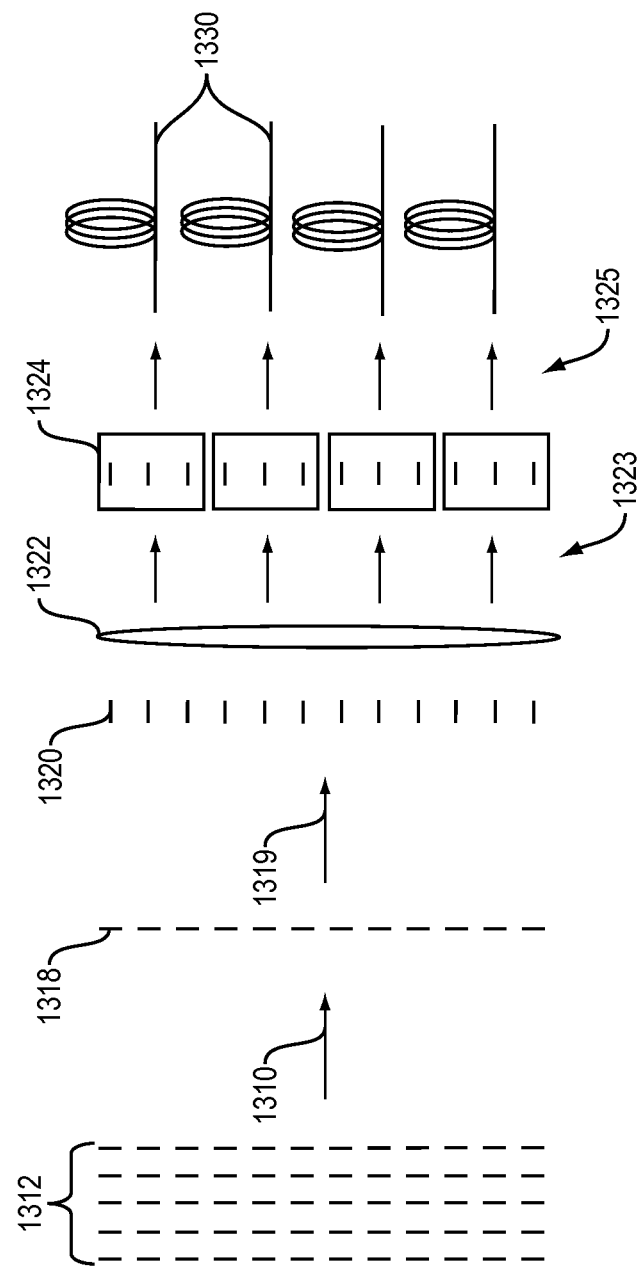
FIGS. 13A-B illustrate an optical schematic embodiment apportioning and coupling a multi-beam asymmetric output, formed by a WBC method, into multiple optical fibers using a single lens and multiple reflective mirrors.
Figure 13B:
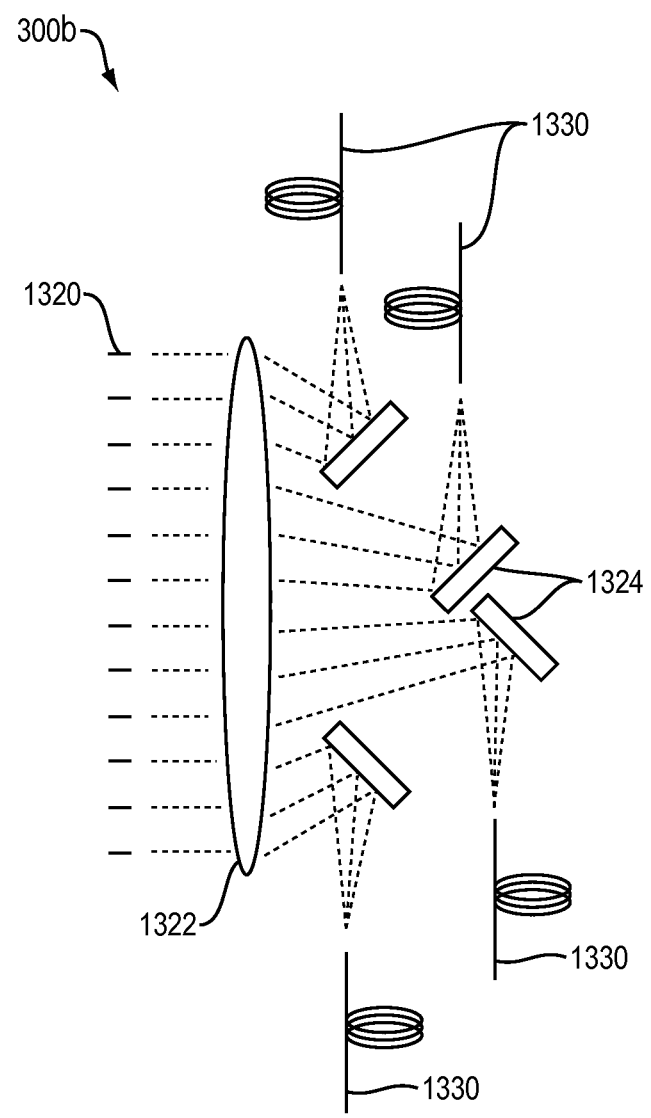

FIGS. 13A-B illustrate optical schematics apportioning and coupling a multi-beam asymmetric output profile 1320, formed by a WBC method, into multiple optical fiber lasers 1330 using a single optical 1322, such as a lens and multiple reflective elements 1324. In the previous embodiment illustrated by FIGS. 12A-B, multiple optical elements 1322 were positioned to receive and apportion sections of output beam profile 1320. Here in FIGS. 13A-B, instead of multiple optical elements initially receiving and apportioning sections of output beam profile 1320, a single optical element 1322 focuses or directs 1323 the entire a second set of reflective elements 1324, which then apportion 1320 and direct 1325 into another optical system, such as each of optical fiber lasers 1330 shown. FIG. 13B shows one such configuration of how a multiple output beam system 1300B uses optical element 1322 to focus output beam profile 1320 to a single focus where portions of the focused profile are reflected and redirected by reflective elements 1324 into individual fiber laser systems. These fiber laser systems may also be individual laser pumps for a single fiber laser system discussed below. Dashed trace lines show the path of each part of the output profile being redirected.

To reiterate some of the advantages of the embodiments just illustrated over prior systems shown in FIGS. 11A-B the following example is submitted. Six conventional lasers may each have a beam quality (shape) that allow each to be coupled into six processing feed fibers where the core diamater/NA fiber is 100 μm/0.22 NA. Using the systems shown in FIGS. 11A-B may be sufficient to do this, but if an assymetrical beam profile such as 1220/1320 shown in FIGS. 12-13B the core diamater/NA fiber might now have to be 150 μm/0.22 NA. Continuing to still use a 100 μm/0.22 NA in this scenario would actually lower the beam quality of the feed fiber, leading to a larger degradation factor in practice of roughly $(150/100)^2 \sim 2.25$ times for each fiber. Multiplying that number by six reduces the total beam quality by a factor of over 12. Thus, illustrating the need for a system as described in the previous embodiments.

Figure 14:
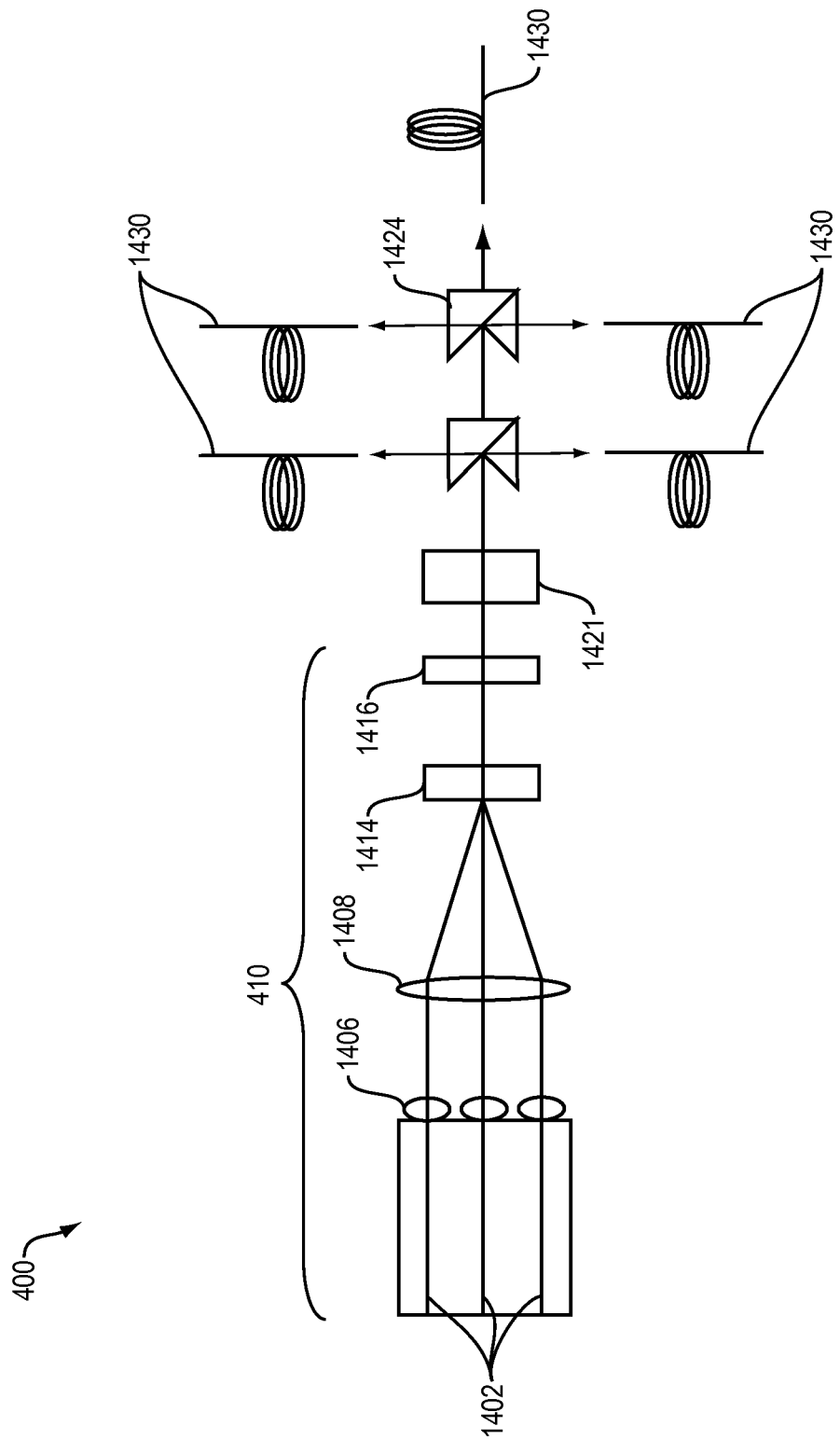
FIG. 14 is a schematic of a multiple output beam system incorporating a WBC method and using non-partially reflective optics.

FIG. 14 is a schematic of a multiple output beam system 1400 incorporating a WBC method and using non-partially reflective optics 1424. Arrays 1402 are shown stacked on top of each other with each having a plurality of laser elements. Individual laser elements are not shown as they would be coming out of the page in the illustration. Array 1402 as shown could be single diode laser bar. However, it is anticipated an array or row of elements could be a fiber laser with multiple elements, multiple individual laser emitters aligned side by side, or any other combination of laser emitters arranged in a one-dimensional array where each emitter emits one or more electromagnetic beams and where the beam's slow diverging dimensions are aligned along the array or row dimension.

The beam path 1404 of each array is illustrated in the figure by a solid line. A single collimation optic 1406 is used to collimate each beam of array 1402 along the fast dimension of each laser element. Transform optic(s) 1408, which could be a cylindrical or spherical lens or mirror or combination, is used to combine each beam 1404 along the WBC dimension (top to bottom as drawn). The transform optics 1408 then overlaps the combined beam onto a dispersive element (shown using a diffraction grating) 1414 where the combined beam is then transmitted as a single output profile onto an output coupler 1416. Dispersive element 1414 could be reflective or transmissive as shown. The output coupler 1416 then transmits the combined beams (see for example 1220/1320 in FIGS. 12-13B). The output coupler 1416 is partially reflective and acts as a common front facet for all the laser elements in this external cavity system 1410. An external cavity is a lasing system 1410 where the secondary mirror is displaced at a distance away from the emission aperture or facet (not labeled) of each laser emitter. Generally, additional optics are placed between the emission aperture or facet and the output coupler or partially reflective surface.

Symmetrization optic(s) 1421 are used to further symmetrize the output profile. Depending on the system, these optics may also be included inside the lasing system 1410 or not included at all. Symmetrization optic(s) 1421 may be comprised of a polarization multiplexer and beam rotator or other selective beam reconfiguring optics. Reflective elements 1424 then apportion and direct the symmetrized output beam profile into multiple optical fiber lasers 1430. Again the multiple reflective elements 1424 are based upon the number of outputs or delivery fiber systems sought for. A focusing optic (not shown), such as a lens or curved mirror, may be placed after reflective elements 1424 to help couple each apportioned profile into individual optical fibers, lasers or other optical systems. It is also understood that reflective elements 1424 may have a flat or curved surface, wherein the curved surface may be configured to focus the reflected portion of the profile.

In other embodiments not shown, apertures may be used to apportion the asymmetric multi-wavelength beam profile in conjunction with other reflective and/or focusing optical elements.

In another embodiment using a WBC system as shown in FIG. 1B, where the output profile may not need further symmetrization except for the natural symmetrizing that occurs by optical apportioning elements subdividing the output profile 120 shown in front view 118 into a plurality of separate profiles, which may be focused into or coupled into another optical system.

Fiber Laser Pumps

As mentioned, WBC laser systems have several advantages of performance for both materials processing applications such as sheet metal cutting and welding, and for pumping fiber lasers. For both materials processing and fiber pumping, it is often of interest to have a laser with multiple output beams. In materials processing, multiple output beams allow the same laser to be shared among different workstations. In fiber pumping, a typical 6+1 to 1 coupler is often used to couple 6 pump diode lasers and 1 seed laser into the fiber laser system. Some pump couplers may couple up to 18 total pump sources into the fiber laser system.

Figure 15:
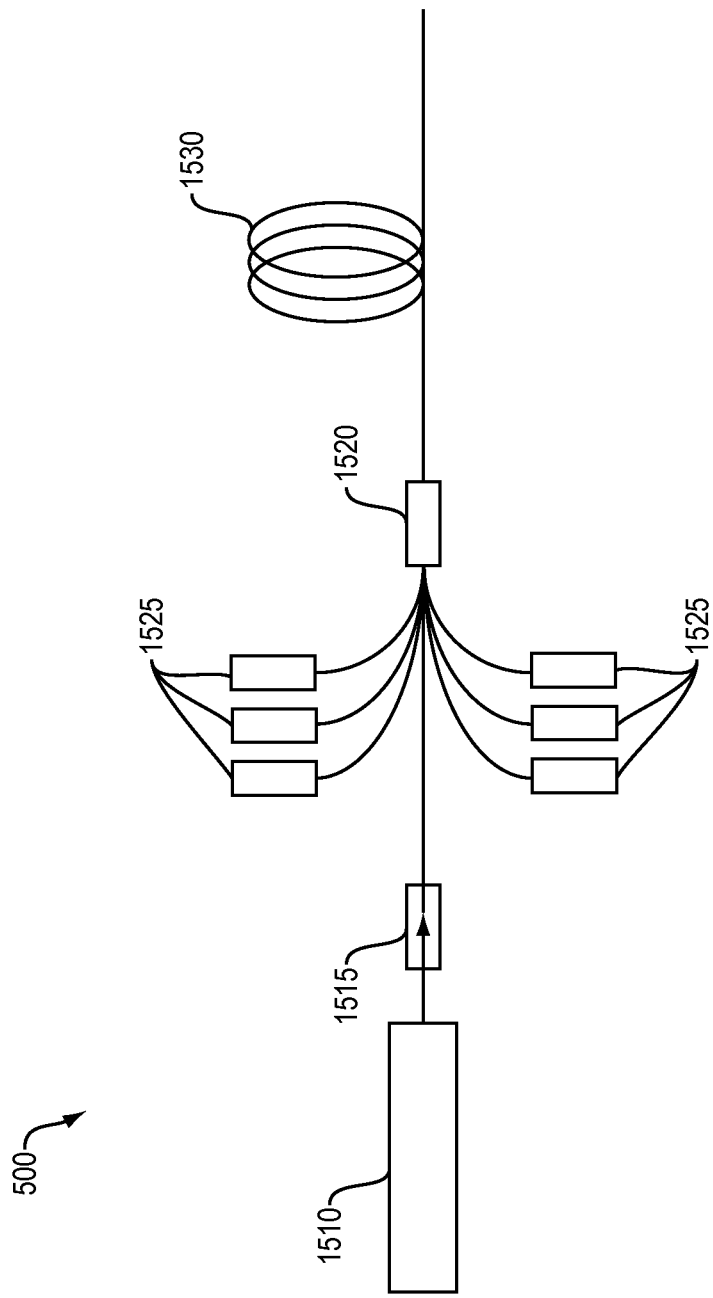
FIG. 15 illustrates a schematic of a fiber pump laser having multiple independent pump sources.

An example of fiber laser system utilizing individual pump sources is shown in FIG. 15. A seed laser or source laser 1510 is used to emit the initial wavelength source 1515 of the fiber pumped laser system 1500. Six individual pump sources 1525, such as laser diodes are then used to pump the doped fiber resonator 1530. All of these sources are coupled into the resonator through a 6+1 fiber coupler 1520.

Figure 16:
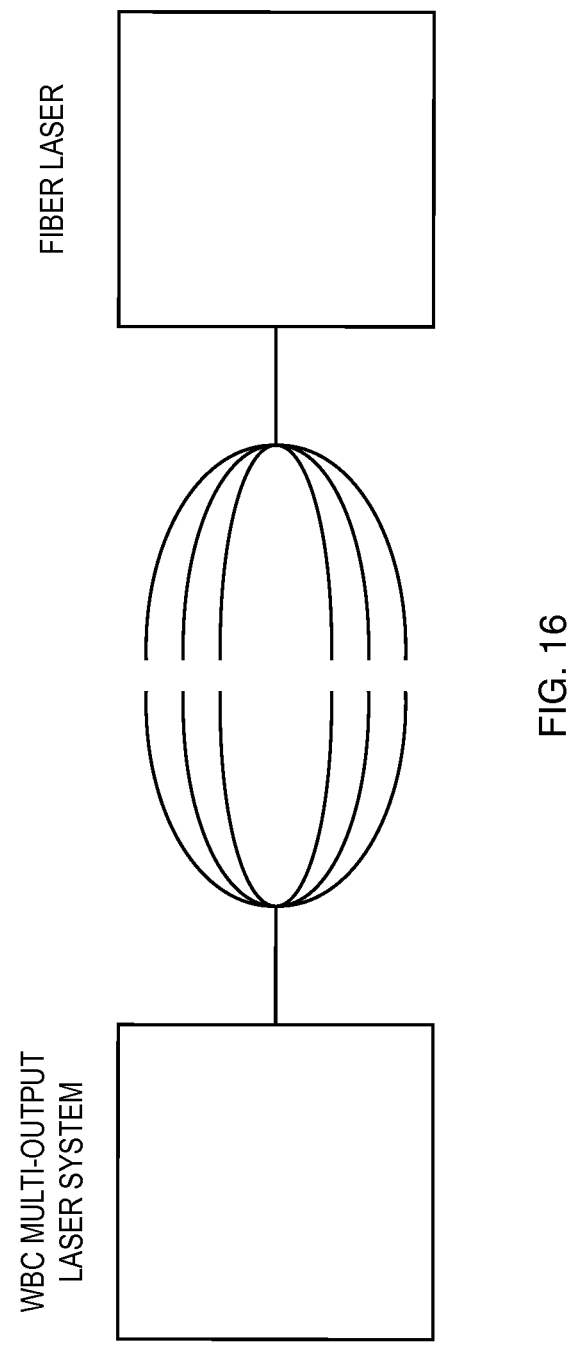
FIG. 16 illustrates a schematic of a single WBC multi-output beam system used as a single source for a fiber pump laser.

Another embodiment of a multiple output WBC laser described hereafter allows for the replacement of individual pump lasers/sources, such as 1525 shown in FIG. 15. The basic concept starts with the use of the fiber-coupled output of a WBC laser, as shown in FIG. 16. When the WBC laser fiber output is connected to a fiber combiner, as shown, the output will be split into multiple outputs. An example is a 6+1 to 1 coupler, produced by various manufactures. For example, one coupler offers a (6+1)×1 kW-Class high power pump and signal combiner. In this configuration there are 6 input pump fibers and one input signal fiber. For kW-class pump and signal combiners, typically each of the 6 input pump fibers has a core/cladding diameter of 200/220 μm with a numerical aperture (NA) of 0.22. Typically the signal input fiber has a core/cladding diameter of 20/400 μm with an NA of 0.06/0.46. The 6×1 fibers are bundled to form an output fiber that has a core/cladding diameter of 20/400 μm with an NA of 0.06/0.46.

Currently, the total power that can be handled by this combiner is 1200 W, which is limited by thermal loading of the coupler. In addition, fiber combiners are available with (18+1)×1 output formats, for eighteen outputs. In our system as shown in figure one, for example, the output of our WBC laser is coupled into a 400 micron diameter fiber with NA of 0.46. The 400 μm/0.46 NA fiber is split into six 200/0.22 fibers. Note that the 20/0.06 signal fiber may be used also, but it is not necessary. The 6 200/0.22 fibers are then spliced to a 6×1 signal and pump combiner where it is used to pump a fiber laser. The 20/0.06 signal fiber may be used as an amplifying port or oscillator port.

An alternative pumping scheme is to couple the 400 μm WBC laser output fibers directly to the 400 μm cladding of the fiber input, for an end-pumping scheme and to get around using the (6+1) to 1 combiner on both the WBC laser and fiber laser sides. The end-pumping approach is actually used by some manufacturers of fiber lasers, but there are at least two drawbacks: (1) there is no access to the signal fiber, which may be used as an amplifying port or oscillator port or wavelength stabilization port for the fiber laser; and (2) the total power at this coupling point may be thermally limited.

A key benefit of this embodiment is that WBC diode lasers have a higher brightness than that of other diode lasers, so that in principle, in the absence of thermal and other limitations of the pump coupler, greater power can be coupled through to the (6+1)×1 coupler. Along with technological improvements to the pump coupler maximum power, which are currently in development by fiber laser manufacturers, our approach will allow for scaling the fiber laser power. WBC diode lasers also allow for the capability of using smaller core size and lower NA fibers than those that are currently available. In addition, coupled with the "WBC Pumps for CW fiber lasers" and "Low Numerical Aperture" embodiment disclosures previously filed, key efficiency improvements in coupling to present fiber pump couplers can be realized.

Higher brightness pump sources also enable higher power fiber lasers through the ability to spatially combine a greater number of pumps and more efficiently couple them into the fiber. Pulsed fiber lasers require high brightness pump modules to reduce the active fiber length and corresponding fiber nonlinearities. Managing these nonlinearities in pulsed fiber lasers enables for lasers with shorter pulse lengths and higher peak power.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A multi-output laser system comprising:
   a wavelength beam combiner configured to produce a multi-wavelength asymmetrical beam profile, comprising:
   a plurality of beam emitters each configured to generate optical radiation having a unique wavelength;
   an optical focusing element arranged to intercept optical radiation from each of the plurality of beam emitters and combine the optical radiation along a beam combining dimension to form a multi-wavelength asymmetrical beam profile;
   a diffraction element positioned at a region of overlap of the optical radiation to receive and transmit the multi-wavelength asymmetrical beam profile; and
   a partially-reflecting output coupler arranged to receive the combined beams from the dispersive element, to reflect a portion of the combined beams toward the dispersive element, and to transmit the combined beams as a multi-wavelength beam comprising optical radiation having a plurality of wavelengths;
   an optical symmetrizing element configured to symmetrize the multi-wavelength asymmetrical beam profile; and
   an optical apportioning element configured to apportion the symmetrized beam and direct each portion to a distinct location.

2. The multi-output laser system of claim 1, wherein the plurality of beam emitters are arranged in a two-dimensional array, and wherein the wavelength beam combiner further includes:
   an optical imaging element configured to image each of the plurality of beam emitters along a slow axis of the beam emitters,
   wherein the optical imaging element is configured to image each of the plurality of beam emitters onto the diffraction element.

3. The multi-output laser system of claim 1, wherein the optical apportioning element is a plurality of reflective mirrors.

4. The multi-output laser system of claim 1, wherein the optical apportioning element is configured to focus at least one apportioned profile.

5. The multi-output laser system of claim 1, wherein at least one portion of the symmetrized beam is directed into an optical fiber.

6. The multi-output laser system of claim 1, wherein each apportionment is equal to or more symmetrized than the symmetrized beam it was apportioned from.

7. The multi-output laser system of claim 1, wherein the optical symmetrization element is an optical rotator configured to selectively rotate one or more beams within the multi-wavelength asymmetrical beam.

8. The multi-output laser system of claim 1, wherein the optical radiation from at least one beam emitter is apportioned and directed into more than one distinct location.

9. The multi-output laser system of claim 1, further including a plurality of optical fibers each configured to receive one of the apportioned symmetrized multi-wavelength beam profiles.

10. The multi-output laser system of claim 1, wherein symmetrizing the asymmetric multi-wavelength beam profile comprises rotating each beam of the profile in a range of 80 to 90 degrees.

11. The multi-output laser system of claim 9, wherein each optical fiber is coupled into a fiber laser system comprising a source laser and an optical gain medium.

12. A multi-output laser system comprising:
    a wavelength beam combiner configured to produce a multi-wavelength asymmetrical beam profile, comprising:
    an optical rotator configured to selectively rotate beams emitted by a plurality of beam emitters,
    an optical element configured to receive and deliver the selectively rotated beams onto a dispersive element, wherein the dispersive element transmits the selectively rotated beams as a combined beam profile, and
    a partially-reflecting output coupler arranged to receive the combined beams from the dispersive element, to reflect a portion of the combined beams toward the dispersive element, and to transmit the combined beams as an asymmetrical multi-wavelength beam comprising optical radiation having a plurality of wavelengths;
    an optical symmetrizing element configured to symmetrize the multi-wavelength asymmetrical beam; and
    an optical apportioning element configured to apportion the symmetrized beam and direct each portion to a distinct location.

13. The multi-output laser system of claim 12, wherein at least two of the beam emitters have a fixed-position relationship.

14. The wavelength beam combiner of claim 12, wherein the beam emitters include a first reflective surface and an optical gain medium.

15. The wavelength beam combiner of claim 12, further including a collimation optic configured to receive beams from the beam emitters and collimate one or more beams along a dimension of the beam.

16. The wavelength beam combiner of claim 12, further including a spatial repositioning element configured to spatially-reposition one or more beams prior to being received by the optical element.

17. The multi-output laser system of claim 12, wherein the optical symmetrization element is a spatial repositioner configured to spatially reposition one or more beams with respect to other beams of the asymmetrical multi-wavelength beam profile.

18. A multi-output laser system comprising:
    a wavelength beam combiner configured to produce a multi-wavelength asymmetrical beam profile, comprising:

a spatial repositioning element configured to selectively reposition beams emitted by a plurality of beam emitters;

an optical element configured to receive and deliver the selectively repositioned beams onto a dispersive element, wherein the dispersive element transmits the selectively repositioned beams as a combined beam profile, and a dispersive element positioned to receive and transmit the combined beams, wherein an asymmetric output profile is formed, and a partially-reflecting output coupler arranged to receive the combined beams from the dispersive element, to reflect a portion of the combined beams toward the dispersive element, and to transmit the combined beams as an asymmetrical multi-wavelength beam comprising a plurality of wavelengths;

an optical symmetrizing element configured to symmetrize the multi-wavelength asymmetrical beam; and an optical apportioning element configured to apportion the symmetrized beam and direct each portion to a distinct location.

19. The multi-output laser system of claim 18, wherein the plurality of beam emitters produces a two-dimensional profile and the spatial-repositioning element reduces the number of beams along a first dimension while increasing the number of beams across a second dimension.

20. The multi-output laser system of claim 18, wherein at least two of the beam emitters have a fixed-position relationship.

21. The multi-output laser system of claim 18, wherein the optical apportioning element is further comprised of:
a first optical element configured to focus the asymmetric beam profile to a focal plane; and
a plurality of reflective elements placed in the focal path of the first optical element, wherein the reflective elements are configured to apportion and individually direct a portion of the asymmetric beam profile to a distinct location.

22. The wavelength beam combiner of claim 18, wherein the plurality of beam emitters produces a two-dimensional profile and the spatial-repositioning element reduces the number of beams along a first dimension while increasing the number of beams across a second dimension.

23. The wavelength beam combiner of claim 18, wherein at least two of the beam emitters have a fixed-position relationship.

24. The wavelength beam combiner of claim 18, further including an optical rotator configured to selectively rotate beams prior to being received by the optical element.

* * * * *